United States Patent [19]
Matsugu et al.

[11] Patent Number: 5,148,036
[45] Date of Patent: Sep. 15, 1992

[54] MULTI-AXIS WAFER POSITION DETECTING SYSTEM USING A MARK HAVING OPTICAL POWER

[75] Inventors: Masakazu Matsugu, Atsugi; Kenji Saitoh, Yokohama, both of Japan

[73] Assignee: Canon Kabushiki Kaisha, Tokyo, Japan

[21] Appl. No.: 835,062

[22] Filed: Feb. 18, 1992

Related U.S. Application Data

[63] Continuation of Ser. No. 732,357, Jul. 18, 1991, abandoned, which is a continuation of Ser. No. 553,314, Jul. 17, 1990, abandoned.

[30] Foreign Application Priority Data

Jul. 18, 1989 [JP] Japan ................. 1-186936

[51] Int. Cl.$^5$ ........................................... G01N 21/86
[52] U.S. Cl. ..................................... 250/548; 356/401
[58] Field of Search ............... 250/548, 557; 356/400, 356/401, 356, 363

[56] References Cited

U.S. PATENT DOCUMENTS

| | | | |
|---|---|---|---|
| 4,037,969 | 7/1977 | Feldman et al. | 356/172 |
| 4,326,805 | 4/1982 | Feldman et al. | 356/399 |
| 4,360,273 | 11/1982 | Thaxter | 356/354 |
| 4,398,824 | 8/1983 | Feldman et al. | 356/401 |
| 4,650,983 | 3/1987 | Suwa | 250/548 |
| 4,815,854 | 3/1989 | Tanaka et al. | 356/363 |
| 4,838,693 | 6/1989 | Uchida et al. | 356/356 |
| 4,848,911 | 7/1989 | Uchida et al. | 356/356 |
| 4,948,983 | 8/1990 | Maruyama et al. | 356/401 |
| 5,028,797 | 7/1991 | Abe et al. | 250/557 |

FOREIGN PATENT DOCUMENTS

| | | |
|---|---|---|
| 3719538 | 12/1987 | Fed. Rep. of Germany . |
| 3719539 | 12/1987 | Fed. Rep. of Germany . |
| 2073950 | 10/1981 | United Kingdom . |

OTHER PUBLICATIONS

Kinoshita et al., "A Dual Grating Alignment Technique for X-Ray Lithography," J. Vac. Sci. Technol. B1(4), Oct.-Dec. 1983, pp. 1276 through 1279.

Primary Examiner—David C. Nelms
Assistant Examiner—John R. Lee
Attorney, Agent, or Firm—Fitzpatrick, Cella, Harper & Scinto

[57] ABSTRACT

A position detecting system, for detecting the position of a substrate having a surface, with respect to a first direction perpendicular to the surface of the substrate and a second direction perpendicular to the first direction, by use of a mark formed on the substrate and having an optical power, is disclosed. The system includes a directing device for directing a radiation beam to the mark so that the radiation beam is deflected by the mark; a sensor for receiving the radiation beam deflected by the mark, wherein the position of the radiation beam incident on the sensor is shiftable in a third direction in accordance with the position of the substrate with respect to the first direction and also is shiftable in a fourth direction, different from the third direction, in accordance with the position of the substrate with respect to the second direction; and a detecting device for detecting the position of the substrate with respect to the first and second directions on the basis of an output of the sensor corresponding to the position of incidence of the radiation beam upon the sensor.

46 Claims, 9 Drawing Sheets

MULTI-AXIS WAFER POSITION DETECTING SYSTEM USING A MARK HAVING OPTICAL POWER

This application is a continuation of prior application Ser. No. 07/732,357 filed Jul. 18, 1991, which application is a continuation of prior application, Ser. No. 07/553,314 filed Jul. 17, 1990, both now abandoned.

FIELD OF THE INVENTION AND RELATED ART

This invention relates to a position detecting system for detecting the position of an article being examined. More particularly, the invention is concerned with a position detecting system effective to detect a positional error and/or an interval between a mask and a wafer, for example, used for manufacture of semiconductor microcircuit devices.

In the field of semiconductor device manufacturing exposure apparatuses, it is known that the interval between a mask and a wafer is measured through an interval measuring device and, after controlling the interval to a predetermined interval, the wafer is exposed to an integrated circuit pattern on the mask with radiation by which the integrated circuit pattern is transferred to the wafer.

FIG. 1 is a schematic view of an interval measuring device for use in an exposure apparatus, as proposed in Japanese Laid-Open Patent Application, Laid-Open No. Sho 61-111402. In FIG. 1, a mask M and a wafer W are disposed opposed to each other with their surfaces placed parallel to each other. Light is projected so that it is converged by a lens L1 and at point $P_S$ between the mask M and the wafer W. Here, light is reflected by the mask M surface and the wafer W surface and, through a lens L2, the reflected lights are projected and converged at points $P_W$ and $P_M$ on a screen S surface. The interval between the mask M and the wafer W can be measured by detecting the spacing between the spots $P_W$ and $P_M$ of converged light on the screen S surface.

In this type of mask-to-wafer interval measurement, it is not possible to detect the positional relationship between the mask and the wafer with respect to a direction perpendicular to a normal to the mask and wafer surface (i.e. in a lateral direction). Namely, it is not possible to detect any positional deviation between the mask and the wafer. Accordingly, in order to detect such positional deviation, use of a specific positional deviation detecting device is necessary, separately from such an interval measuring device. This leads to a complicated structure and makes it difficult to reduce the size.

SUMMARY OF THE INVENTION

It is accordingly an object of the present invention to provide an improved position detecting system by which the position of an article being examined, with respect to a direction substantially perpendicular to the surface thereof as well as in a direction orthogonal to that direction, can be detected easily.

In accordance with an aspect of the present invention, to achieve such an object, there is provided a position detecting system for detecting the position of a substrate having a surface, with respect to a first direction perpendicular to the surface of the substrate and a second direction perpendicular to the first direction, by use of a mark formed on the substrate and having an optical power, said system comprising: directing means for directing a radiation beam to the mark so that the radiation beam is deflected by the mark; a sensor for receiving the radiation beam deflected by the mark, wherein the position of the radiation beam incident on said sensor is shiftable in a third direction in accordance with the position of the substrate with respect to the first direction and also is shiftable in a fourth direction, different from the third direction, in accordance with the position of the substrate with respect to the second direction; and detecting means for detecting the position of the substrate with respect to the first and second directions on the basis of an output of said sensor corresponding to the position of incidence of the radiation beam upon said sensor.

In accordance with another aspect of the present invention, there is provided a position detecting system for detecting the relative position of a first substrate having a surface relative to a second substrate opposed to the first substrate, with respect to a first direction substantially perpendicular to the surface of the first substrate and a second direction perpendicular to the first direction, by use of a first mark formed on the first substrate and having an optical power and a second mark formed on the second substrate and having an optical power, said system comprising: directing means for directing a radiation beam to the second mark and then to the first mark so that the radiation beam is deflected by the first mark; a sensor for receiving the radiation beam deflected by the first mark, wherein the position of the radiation beam incident on said sensor is shiftable in a third direction in accordance with the position of the first substrate with respect to the first direction and also is shiftable in a fourth direction, different from the third direction, in accordance with the position of the first substrate with respect to the second direction; and detecting means for detecting the position of the first substrate with respect to the first and second directions on the basis of an output of said sensor corresponding to the position of incidence of the radiation beam upon said sensor.

The mark with optical power, usable in the present invention, serves to converge or diverge a radiation beam inputted thereto, and such mark can be considered as having a function equivalent to a lens or, alternatively, a mirror having a curved reflection surface.

In one preferred form of the present invention, such a mark comprises a pattern having a predetermined power with respect to the aforesaid second direction but having substantially no power with respect to a fifth direction orthogonal to both the first and second directions. Use of a mark having such power is one method for embodying a system wherein the position of the radiation beam incident on the sensor does not shift in the aforesaid third direction with the position of the article (substrate) in the aforesaid second direction. Also, a mark with such power can serve as a cylindrical lens or a cylindrical mirror, and it is possible to embody a system wherein the shift of the deflected radiation beam in the aforesaid third direction with the displacement of the article (substrate) in the aforesaid second direction, is suppressed. Thus, also in the system according to the second aspect of the present invention, as described, it is desirable to provide each of the first and second marks by a mark structure having such a power.

A mark with optical power usable in the present invention may be provided by forming on a substrate a pattern of a diffraction grating, a convex lens, a concave lens, a convex mirror or a concave mirror. The diffraction grating pattern may be formed by an amplitude type diffraction grating or a phase type diffraction grating. A representative pattern therefor may be that of a Fresnel zone plate. In one preferred form of the present invention, a mark having a similar function as that of a cylindrical lens or a cylindrical mirror is used, by which the radiation beam is deflected in a plane containing the first and fifth directions. Formation of such a beam deflecting mark corresponds to the provision of a cylindrical lens or a cylindrical mirror with inclination relative to an optical axis. Also, deflecting the radiation beam makes it possible to arrange the system so that, upon the sensor, the third direction and the fourth direction are placed in an orthogonal relationship. Therefore, when an area sensor such as a CCD sensor having its picture elements arrayed two-dimensionally is used, it is easy to detect the position of the deflected beam with respect to the aforesaid third and fourth directions.

In the present invention, for detection of the position of a radiation beam incident on the sensor, the position of a center of gravity or a peak of the intensity distribution of the radiation beam received by the sensor may be detected. Here, the term "center of gravity (of the intensity distribution) of the beam" means such a point that, when in the plane receiving the beam a position vector of each point in that plane is multiplied by the light intensity of that point and the thus obtained products are integrated over the entire plane, the integrated value has a "zero vector".

In the present invention, light can be used as the radiation beam. Examples of a light source that produces such light are: a high coherency light source such as a gas laser (e.g., He-Ne laser), a semiconductor laser (LD) and the like; a low coherency light source such as a light emitting diode (LED), a Xe lamp, a Hg lamp and the like; and so on. In the present invention, when light is to be used as the radiation beam, it is preferable to use a monochromatic light or a semi-monochromatic light having a relatively narrow bandwidth. Accordingly, where a Xe lamp or a Hg lamp is to be used, it may preferably be used in combination with a bandpass filter such as an interference filter.

The position detecting system of the present invention is particularly effectively usable in an exposure apparatus for manufacture of semiconductor microcircuit devices such as IC, LSI, etc.

Thus, in accordance with a different aspect of the present invention, there is provided an exposure apparatus usable with first and second substrates opposed to each other, for exposing the first substrate to a circuit pattern of the second substrate with radiation, wherein the first substrate is formed with a first mark having an optical power while the second substrate is formed with a second mark having an optical power, said apparatus comprising: directing means for directing a radiation beam to the second mark and then to the first mark so that the radiation beam is deflected by the first mark; a sensor for receiving the radiation beam deflected by the first mark, wherein, when a first direction is taken as a direction substantially perpendicular to a surface of the first substrate and a second direction is taken as a direction perpendicular to the first direction, the position of the radiation beam incident on said sensor is shiftable in a third direction in accordance with the relative position of the first substrate to the second substrate with respect to the first direction and also is shiftable in a fourth direction, different from the third direction, in accordance with the relative position of the first substrate to the second substrate with respect to the second direction; detecting means for detecting the relative position of the first substrate with respect to the first and second directions on the basis of an output of said sensor corresponding to the position of incidence of the radiation beam upon said sensor; and adjusting means for adjusting the positional relationship between the first and second substrates with respect to the first and second directions, on the basis of the detection by said detecting means.

In accordance with a further aspect of the present invention, there is provided an exposure apparatus usable with first and second substrates opposed to each other, for exposing the first substrate to a circuit pattern of the second substrate with radiation, wherein the first substrate is formed with a mark having an optical power, said apparatus comprising: directing means for directing a radiation beam to the mark so that the radiation beam is deflected by the mark; a sensor for receiving the radiation beam deflected by the mark, wherein, when a first direction is taken as a direction substantially perpendicular to a surface of the first substrate and a second direction is taken as a direction perpendicular to the first direction, the position of the radiation beam incident on said sensor is shiftable in a third direction in accordance with the relative position of the first substrate to the second substrate with respect to the first direction and also is shiftable in a fourth direction, different from the third direction, in accordance with the relative position of the first substrate to the second substrate with respect to the second direction; detecting means for detecting the relative position of the first substrate with respect to the first and second directions on the basis of an output of said sensor corresponding to the position of incidence of the radiation beam upon said sensor; and adjusting means for adjusting the positional relationship between the first and second substrates with respect to the first and second directions, on the basis of the detection by said detecting means.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 2:
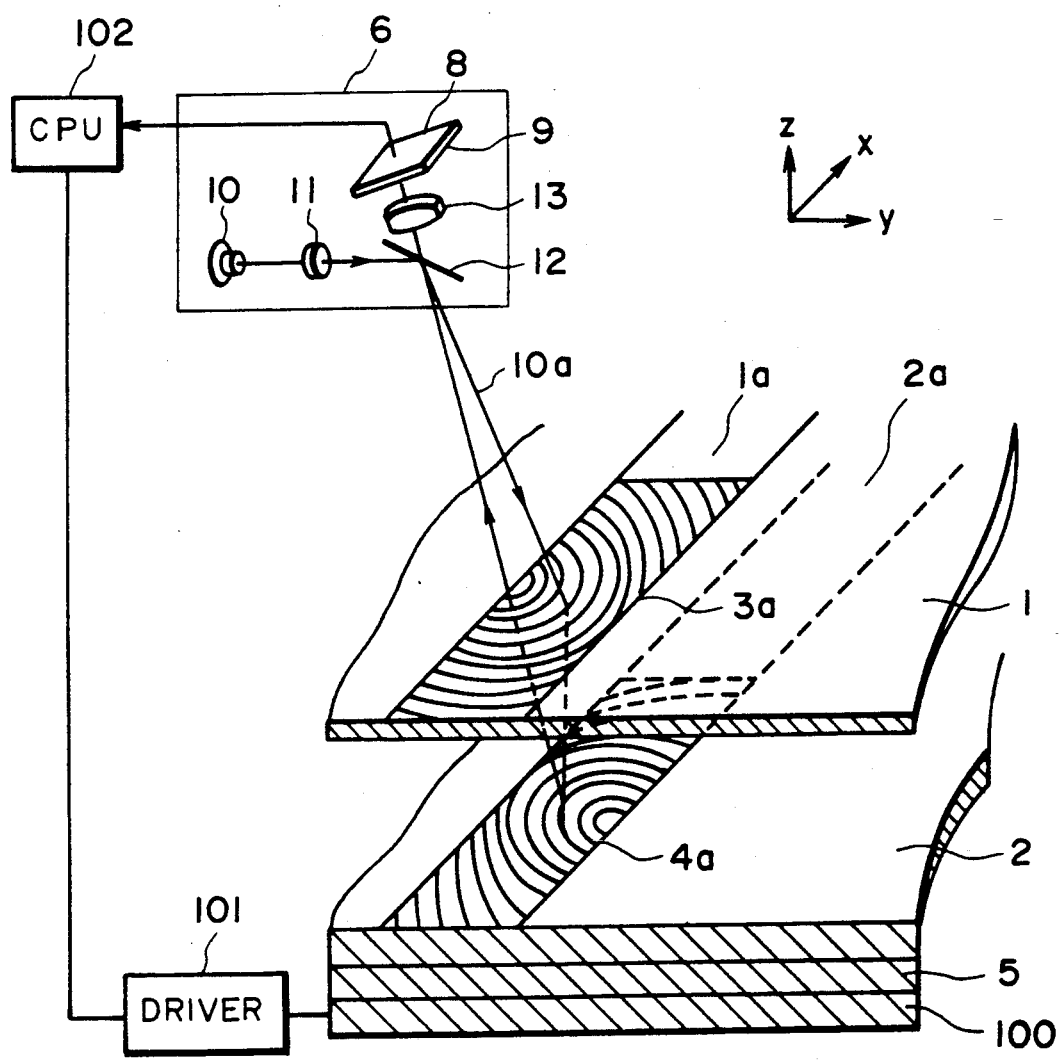
FIG. 2 is a schematic view of an alignment system according to a first embodiment of the present invention.

FIG. 2 is a schematic view of a position detecting system (or an alignment system) according to a first embodiment of the present invention. The device of this embodiment can be suitably incorporated into an X-ray exposure apparatus of proximity exposure type.

In the drawing, denoted at 1 is a mask (first object or substrate) having an integrated circuit pattern formed thereon; at 2 is a wafer (second object or substrate) having an X-ray sensitive layer (resist) formed thereon; at 1a and 2a are scribe lines formed on the mask 1 and the wafer 2, respectively; and at 3a and 4a are first and second physical optic elements each having an optical power and each being provided by an optical element effective to transform the wavefront of a beam inputted thereto. In this embodiment, each physical optic element is provided by a lens element having a grating pattern, similarly to a Fresnel zone plate, and is used as a mark for the position detection.

Denoted at 5 is a wafer chuck for holding the wafer 2 by attraction, and denoted at 6 is an alignment head that accommodates therein various elements for the alignment (position detection) purpose. Denoted at 8 is a photodetector; at 9 is a light receiving surface of the photodetector 8; at 10 is a light source; at 11 is a light projecting lens system; at 12 is a half mirror; and at 13 is a cylindrical lens. The photodetector 8 comprises a CCD area sensor having its light receiving elements arrayed in the x-axis direction and in a direction perpendicular thereto.

Denoted at 100 is an X-Y-Z stage which is movable in the directions of x, y and z axes. The stage 100 is operable to move the wafer 2, attracted to the wafer chuck 5, in the x, y and z directions. Denoted at 101 is a stage driver for moving the X-Y-Z stage 101 in the x, y and z directions. Denoted at 102 is a central processing unit (CPU) which is operable to supply an instruction signal to the stage driver 101 to cause the same to move the X-Y-Z stage 100 for alignment of the mask 1 and the wafer 2 with respect to the x and y directions or for gap setting of the mask 1 and the wafer 2 to a predetermined value. In the present embodiment, for the mask-to-wafer alignment with respect to the x and y directions as well as for the gap setting (i.e., alignment with respect to the z direction), the X-Y-Z stage 100 is moved to displace the wafer 2. However, a moving mechanism may be provided to move a mask chuck (not shown) supporting the mask 1 and, by using such a mechanism, the mask 1 may be displaced in the x, y and z directions.

The X-Y-Z stage 100 comprises a fine-motion wafer stage to be actuated by a piezoelectric device and a rough-motion wafer stage to be actuated by a stepping motor. The stage driver 100 comprises this piezoelectric device and this stepping motor. For displacement of the wafer 2 through a small distance, the CPU 102 supplies an instruction signal to the piezoelectric device, whereas for displacement of the wafer 2 through a relatively large distance, the CPU 102 supplies an instruction signal to the stepping motor.

In FIG. 2, the mask 1 and the wafer 2 are supported with a spacing (gap) within a predetermined range, with respect to the z-axis direction which is substantially perpendicular to the surface of the mask and wafer.

In the present embodiment, light emanating from the light source 10 is transformed by the light projecting lens system 11 into parallel light which, after impinging on the half mirror 12, is projected on the mark 3a of the mask 1 in an oblique direction, inclined with respect to a normal to the mask 1 surface.

Here, the first mark 3a has a function of what can be called a "cylindrical lens", converging or diverging a received light in the x direction but not converging or diverging the same in the y direction, and serves to deflect the light 10a inputted thereto from the alignment head 6 with a predetermined angle such that the principal ray of the emanating light coincides with the negative z direction within the y-z plane. This optical action corresponds to the provision of a cylindrical lens with inclination relative to the optical axis. On the other hand, the second mark 4a has a function for converging or diverging a received light in the x direction with respect to which the marks 3a and 4a should be aligned. But, the second mark 4a has neither a light converging function nor a light diverging function with respect to the y direction. The second mark 4a serves to deflect, in the y-z plane, the light inputted thereto along the z direction, so as to direct the same to the cylindrical lens 13. The lens 13 has a light converging function with respect to the direction which is perpendicular to both the x direction and the direction of its optical axis, but it has no function for converging or diverging the light with respect to the x direction.

Now, description will be made of the manner of detecting the relative position of the first and second marks 3a and 4a with respect to the x direction.

As described, the first mark 3a has a light converging or diverging function with respect to the x direction, and it serves to diffract the light 10a such that first order transmissive diffraction light emanates therefrom along a normal to the mask 1 (i.e. in a negative z direction) and impinges on the second mark 4a. Like the first mark 3a, the second mark 4a has a light converging or diverging function with respect to the x direction, and serves to diffract the light from the first mark 3a such that first order reflective diffraction light emanates toward the alignment head 6. The reflective diffraction light goes through the half mirror 12 and the cylindrical lens 13, having no lens function with respect to the x direction, and thereafter, it is collected on the light receiving surface 9 of the photodetector 8.

In the present embodiment, as described, the mark 3a of the mask 1 and the mark 4a of the wafer 2 are each provided by a grating pattern which functions as a lens having a predetermined focal length in the x direction. More specifically, the light 10a inputted obliquely to the mask 1 surface from the alignment head 6, is deflected by the mark 3a of the mask 1 in the direction of a normal to the mask (negative z direction) toward the mark 4a of the wafer 2, so as to be collected at a predetermined position (in this embodiment, a distance −187.0 micron from the mask 1 surface in the z direction.

In the present embodiment, the angle $\alpha$ of incidence of the light 10a upon the mask 1 is preferably within a range of $10 < \alpha < 80$ (deg).

In this embodiment, the mark 4a of the wafer 2 comprises an off-axis type grating lens having a grating pattern which is asymmetrical with respect to the z axis, such that the direction of advancement of the principal ray of the diffraction light, emanating from the mark 4a, is deviated from the direction of an optical axis of the light inputted thereto (i.e. the direction of advancement of its principal ray). In this particular example, the mark 4a is designed to have a focal length $-185.15$ microns, and serves to direct the convergent light (or divergent light), produced by transmissive diffraction through the mark 3a of the mask 1, toward the cylindrical lens 13 of the alignment head 6. After being influenced by the lens functions of the marks 3a and 4a, the light 10a goes through the cylindrical lens 13 and impinges on the photodetector 8.

The principle of detecting the relative position of a mask and a wafer will now be explained in greater detail. First, a reference position upon the light receiving surface 9 of the photodetector 8 is determined. This reference position corresponds to the position, upon the surface 9, of the center of gravity of the light 10a with respect to the x direction as assumed when a mask and a wafer are set with correct alignment (no relative positional deviation) in the x direction and with correct interval (gap). Such reference position can be determined by calculation based on various design data. Alternatively, it may be determined by trial printing. In any case, the thus determined reference position is memorized into a memory of the CPU 102.

On an occasion when a wafer 2 introduced into the exposure apparatus has a positional deviation relative to the mask 1, the mask and wafer marks 3a and 4a are in such a relationship that the coaxial alignment of lenses in an ordinary optical system is destroyed. Therefore, in accordance with the amount of such positional deviation, the x-axis component of the emission angle of the light emanating from the mark 4a changes from the state as assumed when no positional deviation is present. Accordingly, the positional deviation of the wafer 1 in the x direction causes displacement of the position of the gravity center of the light 10a upon the light receiving surface 9 of the photodetector 8, in the x direction from the reference position. Here, provided that the positional deviation is in a certain small range, the displacement of the gravity center position of the light 10a upon the light receiving surface 9 in the x direction from the reference position, is proportional to the relative positional deviation of the mark 3a of the mask 1 and the mark 4a of the wafer 2 in the x direction.

Assuming now that the mask 1 and the wafer 2 are relatively deviated by $\Delta\sigma$ in the x direction, that the distance from the wafer 2 to the point of convergence (or the origin of divergence) of the light having been transmissively diffracted by the mark 3a of the mask 1 is denoted by a and that the distance from the wafer 2 to the light receiving surface 9 is denoted by b, then a deviation or displacement $\Delta\delta$ of the center of gravity of the spot of focused light upon the light receiving surface 9 with respect to the x direction, can be given by the following equation:

$$\Delta\delta = \Delta\sigma \times (b/a + 1) \quad \text{(a)}$$

Namely, the deviation $\Delta\delta$ of the center of gravity of light is being magnified at an enlarging magnification which is equal to "$b/a+1$". This means that, by selecting a sufficiently large value for the enlarging magnification $A = (b/a+1)$, it is possible to detect minute relative positional deviation of the mask 1 and the wafer 2, as an enlarged displacement of the gravity center of the light.

If, as an example, $a = 0.5$ mm and $b = 50$ mm, the deviation $\Delta\delta$ of the center of gravity of the light is being magnified by 101 (one hundred and one) times larger than the relative positional deviation $\Delta\sigma$ of the mask 1 and the wafer 2, in accordance with equation (a). When the photodetector 8 has a resolution of 0.1 micron, a position resolution on an order of 0.001 micron is obtainable with regard to the positional deviation $\Delta\sigma$.

By moving the X-Y-Z stage 100 on the basis of the thus determined positional deviation $\Delta\sigma$, the mask 1 and the wafer 2 can be aligned with each other at high precision.

As described in the foregoing, the light 10a is transmissively diffracted by the mark 3a of the mask 1 and then is reflectively diffracted by the mark 4a of the wafer 2, by which the light 10a is received by the light receiving surface 9 of the photodetector 8 within the alignment head 6 in the form of a light with a relative deviation of the optical axes of the marks 3a and 4a of the mask 1 and the wafer 2 in the x direction being magnified by n ($n > 1$). Then, by using the photodetector 8, the position of the gravity center of the received light 10a with respect to the x direction is detected.

Here, the gravity center position of the light 10a does not shift along the light receiving surface 9 in a direction perpendicular to the x direction, with the relative positional deviation of the mask 1 and the wafer 2 in the x direction. Also, if the wafer 2 displaces in the y direction, no change occurs in the light 10a impinging on the mark 4a of the wafer 2. Since in the y direction the mark 4a has a light deflecting function only, any shift of the position of incidence of the light 10a upon the mark 4a in the y direction does not cause a change in the orientation of the light emanating from the mark 4a. Accordingly, the gravity center position of the light 10a on the light receiving surface 9 is unchanged. It is to be noted here that the mark 4a of the wafer 2 should have a slightly large size in the y direction so as to prevent that, with a possible positional deviation of the wafer 2 in the y direction, the light from the mark 3a of the mask fails to impinge upon the mark 4a.

Next, the principle of mask-to-wafer gap detection, namely, the principle of detecting the relative position of the mask and the wafer with respect to the z direction, will be explained. Considering the light 10a in terms of projection upon the y-z plane, the light 10a is deflected in the negative y direction by means of the mark 3a of the mask 1 and then it is deflected in the negative y direction by means of the mark 4a of the wafer 2, such that the principal ray thereof emanates in an oblique direction with a certain angle $\psi$ (the angle being measured in the y-z plane) with respect to a normal (z direction) to the wafer 2 surface. After being influenced by the lens function of the cylindrical lens 13 of the alignment head 6, it is received by the photodetector 8.

If the gap between the mask 1 and the wafer 2 changes from a correct value, the initial point of the light 10a emanating from the wafer 2 at the angle $\psi$ changes which causes a change in the position of incidence of the light 10a on the cylindrical lens 13. Since the lens 13 has a lens function with respect to a direction (hereinafter "perpendicular direction") which is perpendicular to both the x direction and the direction of the optical axis, the change in the position of incidence of the light 10a thereupon causes a change in the angle of emission of the light emanating therefrom. Since the light receiving surface 9 of the photodetector 8 is placed at a distance, from the cylindrical lens 13, larger than the focal length of the lens 13, such a change in the angle of emission of the light 10a from the lens 13 directly corresponds to displacement of the gravity center position of the light 10a upon the light receiving surface 9, from the reference position and with respect to the perpendicular direction. If the change in the angle of emission is within a small range, from the relationship described above, the amount of displacement of the gravity center position of the light 10a on the light receiving surface 9, from the reference position with respect to the perpendicular direction, is proportional to the quantity of gap error of the mask 1 and the wafer 2 with respect to a predetermined correct gap, namely, the position of the mask 1 or the wafer 2 in the z direction.

When the focal length of the cylindrical lens 13 is denoted by f and the distance from the focal point position to the light receiving surface 9 is denoted by l, the following relation is provided between the gap error $\Delta z$ of the mask 1 and the wafer 2 and the displacement $\Delta \delta$ of the gravity center position of the light 10a on the light receiving surface 9 with respect to the perpendicular direction:

$$\Delta \delta = (l \sin \psi)/f \cdot \Delta z \qquad (b)$$

Accordingly, by detecting the displacement of the gravity center position of the light 10a in the perpendicular direction through the photodetector 8, it is possible to detect the gap error $\Delta z$ in accordance with equation (b). By selecting a sufficiently large value for the magnification $B = (l \sin \psi)/f$, it is possible to detect that a minute gap error has an enlarged displacement of the center of gravity of the light 10a.

In the present embodiment, as described hereinbefore, the light 10a is responsive to both the relative positional deviation of the mask 1 and the wafer 2 in the x direction and the relative positional deviation of the mask 1 and the wafer 2 in the z direction (i.e., the gap error), and produces displacement on the light receiving surface 9 of the photodetector 8 in the x direction and the perpendicular direction, respectively. Thus, by detecting any deviation of the light 10a from the reference position with respect to both the x direction and the perpendicular direction, with the use of the photodetector 8, it is possible to detect the relative positional deviation of the mask 1 and the wafer 2 both with respect to the x direction and with respect to the z direction (i.e., the gap error), with the use of a common light and a common detecting system. Therefore, the structure of the position detecting system can be made simple and compact.

When the coordinate system of FIG. 2 is rotated about the z axis by 90 degrees, the position detecting system of the illustrated embodiment can be used for detection of any positional deviation with respect to the y direction. Thus, the exposure apparatus of the present embodiment is equipped with such a y-direction position detecting (and gap detecting) system, in addition to the detecting system of FIG. 2, so as to allow three-dimensional position detection for the mask 1 and the wafer 2.

The focal lengths of the marks 3a and 4a of the mask 1 and the wafer 2 are set, while taking into account the gap between the mask 1 and the wafer 2 to be assumed at the time of exposure (pattern transfer) as well as the magnification necessary for the detection of positional deviation with respect to the x and y directions.

In the exposure apparatus of the present embodiment, the relative positional deviation of the mask 1 and the wafer 2 with respect to the x and y directions is transformed, with an enlarging magnification of $\times 100$, into a displacement of the gravity center position of the light 10a on the light receiving surface 9 of the photodetector 8, and such displacement is detected by the photodetector 8. Based on this, detection of three-dimensional relative positional deviation of the mask 1 and the wafer 2 is performed in an X-ray exposure apparatus of proximity type wherein the gap between the mask 1 and the wafer 2 to be assumed at the time of exposure is set to be equal to 30 microns.

It is now assumed that the light source 10 comprises a semiconductor laser and the light 10a therefrom has a wavelength of 0.83 micron. Here, the light 10a that has passed through the light projecting lens system 11 of the alignment head 6 is transformed into parallel light and then goes by way of the half mirror 12, the mask 1, the wafer 2 and the mask 1, again, wherein the light goes through a grating system comprising the marks 3a and 4a. The power arrangement of such a grating system is exemplified in the schematic views of FIGS. 3 and 4. While in these examples the two marks 3a and 4a are illustrated as transmission type marks 3b and 4b; 3c and 4c, if one of the two marks is of a reflection type such as in the FIG. 2 example, the function is the same in principle.

Figure 3:
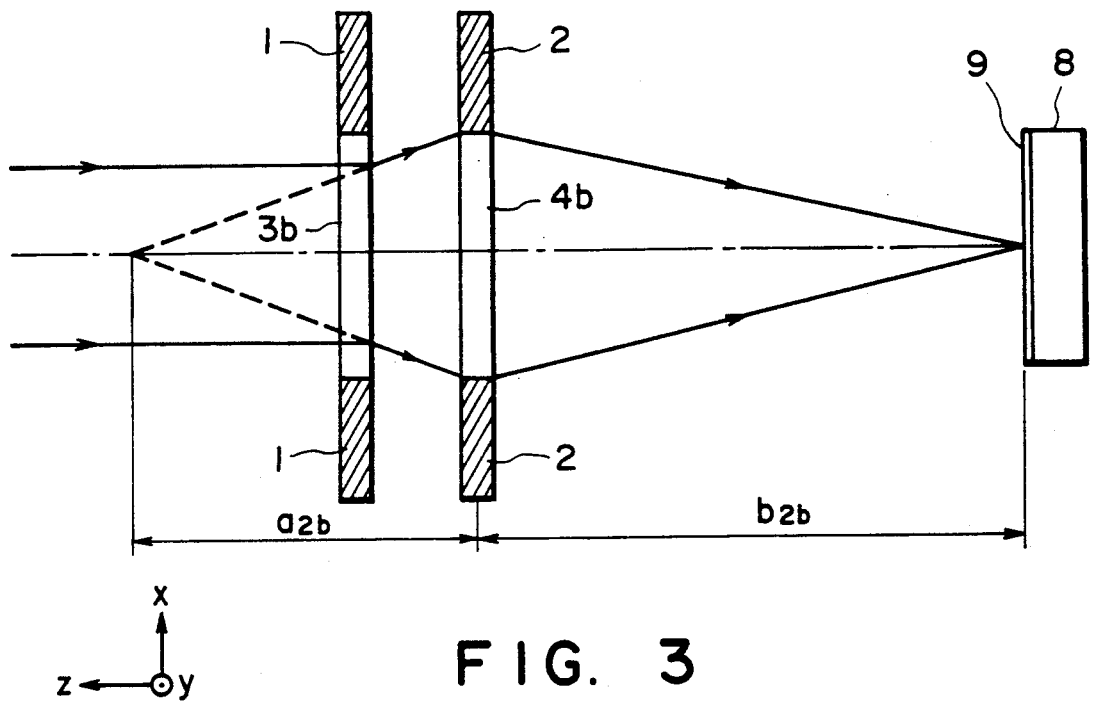
FIGS. 3 and 4 illustrate the power arrangement of grating lenses.
Figure 4:
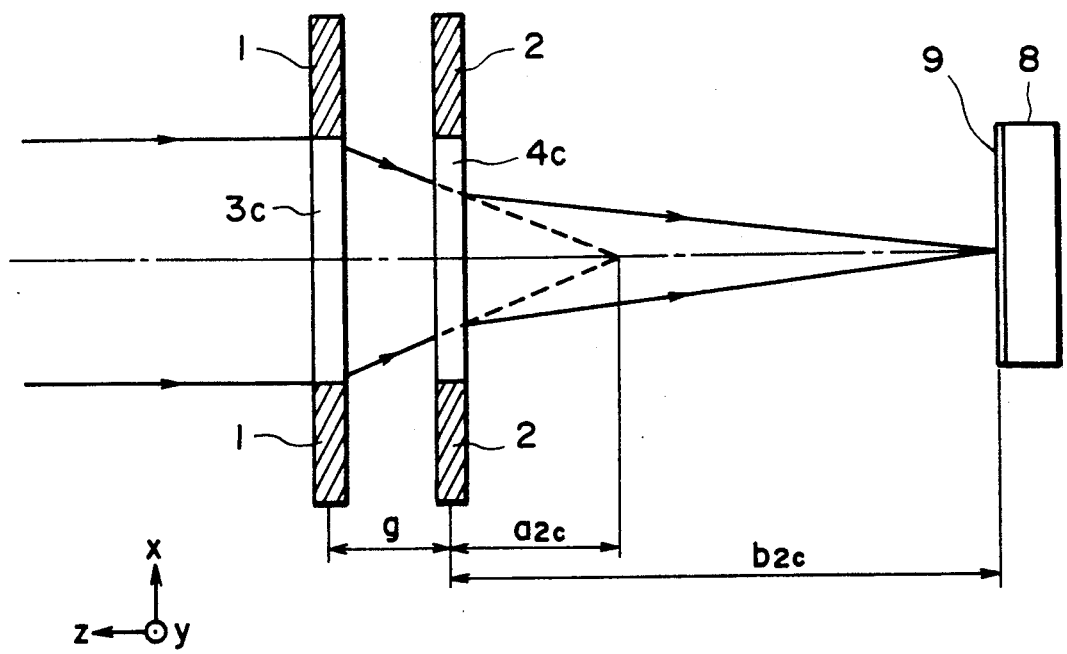

More specifically, FIG. 3 illustrates a case where the mark 3b of the mask 1 has a negative refracting power and the mark 4b of the wafer 2 has a positive refracting power. FIG. 4 illustrates a case where the mark 3c of the mask 1 has a positive refracting power and the mark 4c of the wafer has a negative refracting power. Here, whether the refracting power is negative or positive is determined, depending on whether negative order diffraction light or positive order diffraction light is to be used.

Optical geometry of a grating pattern for each of a mask grating mark 3a and a wafer grating mark 4a, usable in this embodiment, will now be explained.

Figure 1:
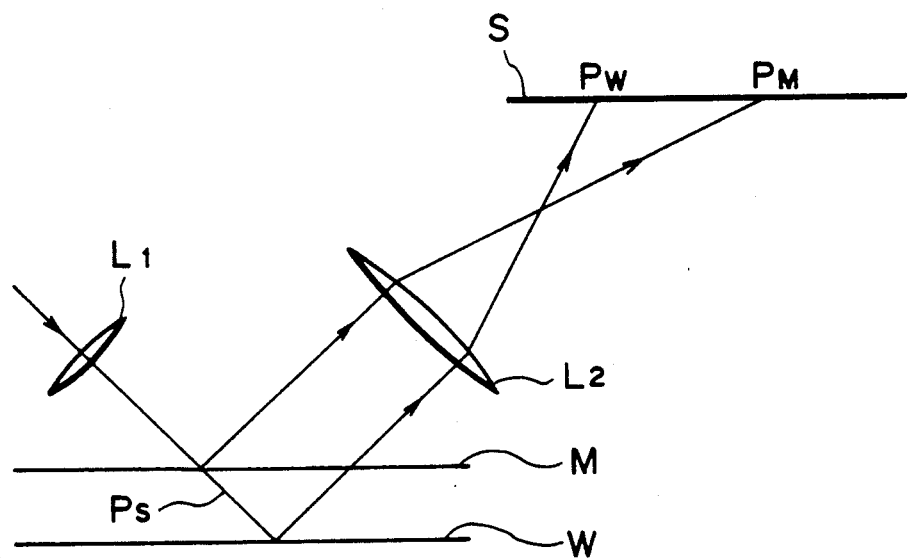
FIG. 1 is a schematic view of a known type interval measuring device.

First, a mark 3a for the mask 1 can be designed so that, when a parallel light of a predetermined beam diameter is incident thereupon at a predetermined angle, the light is focused at a predetermined position. Usually, a pattern of a grating mark 3a may be that of an interference fringe which can be formed on the mask 1 surface, on which the mark 3a is to be provided, on an occasion when mutually coherent light sources are disposed at a light source position (object point) and the position of an image point. Assumingly, a coordinate system is defined on the mask 1 surface, such as shown in FIG. 1. The origin is at the middle of the width of the scribe line 1a, the x axis is in the direction of the scribe line, the y axis is in the widthwise direction and the z axis is in the direction of a normal to the wafer 2 surface. Equations regarding a group of curved lines of such a grating pattern by which a parallel light, having been obliquely inputted thereto at an angle $\alpha$ with respect to the normal to the wafer 2 surface and with its projection to the x-z plane being perpendicular to the lengthwise direction of the scribe line, is imaged after being transmissively diffracted through each point (x, y, o) on the mark 3a, at the position of a convergent point $(x_1, y, z_1)$ wherein $x_1$ and $z_1$ are constants, can be expressed in the following manner, with the contour position of each grating line being denoted by x and y:

$$Y\sin\alpha + P_1(x) - P_2 = m\lambda/2 \quad (2\text{-a})$$

$$P_1(x) = \sqrt{(x-x_1)^2 + z_1^2}$$

$$P_2 = \sqrt{x_1^2 + z_1^2}$$

wherein $\lambda$ is the wavelength of the light $10a$ and m is an integer.

Assuming now that a chief ray is such a ray being incident on the mask 1 with an angle $\alpha$ and passing through the origin on the mask and then impinging upon a convergent point $(x_1, y, z_1)$, then the right side of equation (2-a) shows that, depending on the value of m, the optical path length is "$\lambda \times m/2$" times longer (shorter) than that for the chief ray; and the left side denotes the difference in length, with respect to the optical path of the chief ray, of the optical path of such a ray that passes a point (x, y, o) on the mask and then impinges on the point $(x_1, y, z_1)$.

On the other hand, a mark $4a$ to be provided on a wafer 2 can be designed so as to collect, at a predetermined position corresponding to the position of the light receiving surface 9, a cylindrical wave emanating from a predetermined linear light source. When the gap between a mask 1 and a wafer 2 to be assumed at the time of exposure is denoted by g, then the position of such a linear light source can be expressed by $(x_1, y_1, z_1-g)$.

Assuming now that the mask 1 and the wafer 2 are to be aligned with respect to the x-axis direction and that, upon completion of alignment, the light $10a$ is focused at a point $(x_2, y-y_2, z_2)$ on the light receiving surface 9, wherein $x_1$, $y_1$ and $z_1$ are constants, equations regarding a group of curved lines of a grating pattern for the mark $4a$ of the wafer 2 can be expressed, in the coordinate system defined hereinbefore, as follows:

$$\sqrt{(x-x_2)^2 + y_2^2 + z_2^2} - \sqrt{(x-x_1)^2 + (z_1-g)^2} = \quad (2\text{-b})$$

$$\sqrt{x_2^2 + y_2^2 + z_2^2} - \sqrt{x_1^2 + z_1^2} + m\lambda/2$$

Equation (2-b) is such an equation that satisfies a condition by which, assuming that the wafer surface is at $z = -g$ and that the chief ray of the light $10a$ is such a ray that passes the origin on the mask 1 and a point (0, 0, $-g$) on the wafer 2 and additionally a point $(x_2, y_2, z_2)$ on the light receiving surface 9, the difference in length between the path of the chief ray and the path of a ray passing each point of the coordinate (x, y, $-g$) on the wafer 2 becomes equal to a multiple, by an integer, of a half wavelength.

Equations (2-a) and (2-b) are each for designing a grating pattern having a function equivalent to that of a cylindrical lens having a lens function only with respect to the x direction, with respect to which the positional deviation should be detected.

Generally, an alignment mark for a mask can be formed as an amplitude type diffraction grating of "0 and 1" in which two regions, a region (transparent portion) that can transmit light and a region (light blocking portion) which does not transmit light, are formed alternately. On the other hand, an alignment mark for a wafer can be formed as a phase type diffraction grating having a rectangular section. In the mark $3a$ of the mask 1, the linewidth ratio of the light transmitting portion and the light blocking portion is 1:1, and in the mark $4a$ of the wafer 2, the line and space ratio of the diffraction grating is 1:1.

As an example, a mark $3a$ on a mask can be formed by transferring, onto an organic thin film of polyimide, a grating pattern of a reticle prepared beforehand by use of electron beam exposure technique. On the other hand, a mark $4a$ of a wafer can be formed by preparing on a particular mask a grating pattern to be printed on a wafer and then by transferring the pattern to the wafer by a lithographic process.

Referring back to FIG. 2, description will be made of a case where, in this embodiment, a particular positional deviation is given between a mask and a wafer. It is now assumed that the mask-to-wafer gap has been set at a correct value.

Light emanating from a semiconductor laser (light source) 10 of a wavelength 830 nm, passes through the light projecting lens system 11 and is transformed into parallel light of a half width of 600 microns The parallel light is projected from the alignment head 6 upon a mask 1 surface at an angle of 17.5 degrees with respect to a normal (z direction) to the mask 1 surface.

On a scribe line $1a$ upon the mask 1, a mark $3a$ having a width 60 microns (in the y direction) and a length 180 microns (in the x direction) and having a lens function, is formed. Also, on a scribe line $2a$ upon a wafer 2, a mark $4a$ having the same size as that of the mark $3a$ and having a lens function, is formed. Fine motion of the wafer stage as actuated by a piezoelectric device as well as rough motion of the wafer stage as actuated by a stepping motor, can be measured by using an unshown measuring machine (resolution 0.001 micron), in a temperature controlled chamber at a controlled temperature of $23\pm0.5°$ C. A two-dimensional CCD area sensor having its picture elements arrayed in the x direction and is a direction perpendicular thereto, is used as the photodetector 8, in the alignment head 6, for detection of the gravity center position of the light $10a$. Output signals from the area sensor are processed so as to be standardized with respect to the total light intensity on the whole light receiving surface 9, by the CPU 102. This assures that, even if the output power of the light source 10 changes slightly, the gravity center position of the light $10a$ with respect to the x direction and the perpendicular direction is detected correctly on the basis of the signal output from the area sensor. The resolution of such an area sensor for the position of the center of gravity was 0.2 micron, when actually measured with the use of a semiconductor laser of 50 mW.

In a design example of a mark $3a$ of a mask 1 and a mark $4a$ of a wafer 2, in the first embodiment, the marks are so set that the light $10a$ is displaceable upon the light receiving surface 9 while magnifying by $\times 100$ a positional deviation between the mask and the wafer. As a consequence, the positional deviation of a magnitude 0.01 micron between a mask and a wafer causes effective displacement of the center of gravity of the light upon the light receiving surface 9 of an amount of 1 micron, which displacement can be measured at a resolution of 0.2 micron.

Here, to the relative positional deviation of the mask and the wafer, the detected gravity center position has a linear relationship, taking as a proportional constant the magnification of the grating system which is determined by the power of each of the marks 3a and 4a and the disposition of these marks and the photodetector 8. If, however, the positional deviation goes beyond a certain value (20 microns in this embodiment), the linearity is destroyed and a nonlinear relationship appears. This is because of the fact that the wavefront aberration of the light 10a grows with an increase in the amount of relative positional deviation of the marks 3a and 4a of the mask and the wafer and, as a result, asymmetry appears in the configuration of the spot of light 10a formed on the light receiving surface 9 of the photodetector 8. The wavefront aberration is larger with a larger numerical aperture (NA) of each mark 3a or 4a. Therefore, preferably a smaller NA is used when a mark having an optical power is formed in a limited area.

An alignment system structured in accordance with the present embodiment assures a resolution of 0.002 micron for the positional deviation as well as a deviation measuring range of ±20 microns (linear relationship region).

Next, description will be made of a case where the gap between the mask 1 and the wafer 2 has changed from a predetermined gap. With the change in the gap from the predetermined, the gravity center position of the light 10a on the light receiving surface 9 shifts in the aforesaid perpendicular direction, and such a change as measured through the photodetector 8 can be expressed by equation (b). Accordingly, on the basis of the gravity center position of the light 10a upon the light receiving surface 9 with respect to the perpendicular direction, the magnitude of the gap can be measured. In this embodiment, a measurement range of 10-90 microns, a resolution of 0.03 micron, deviation from linearity of 4.8%, and a linear relationship region of 50-80 microns, are obtained.

As regards the sequence for the gap setting of a mask and a wafer as well as the alignment with respect to the x direction, one of the following methods may be adopted:

The first method is that: Equations (a) and (b) that represent the relationship between (i) the relative positional deviation $\Delta\sigma$ of a mask and a wafer and a change $\Delta z$ in the gap between them and (ii) signals $\Delta\delta$ and $\Delta\gamma$ corresponding to the displacement of the gravity center position of the light 10a on the light receiving surface 9 of the photodetector 8, is predetected and memorized into a memory of the CPU 102. From actually obtained values of the signals $\Delta\delta$ and $\Delta\gamma$ representing the displacement of the gravity center position, the change $\Delta z$ in the gap and the relative positional deviation $\Delta\sigma$ between the mask and the wafer, are determined. Then, the mask 1 or the wafer 2 is displaced by an amount corresponding to the thus determined gap error $\Delta z$ and the positional deviation $\Delta\sigma$.

The second method is that: From the signals $\Delta\delta$ and $\Delta\gamma$ of the photodetector 8, corresponding to the displacement of the gravity center position, those directions that cancel the gap error $\Delta z$ and the positional deviation $\Delta\sigma$ are determined and, in those directions, the mask or the wafer is moved. Then, until the gap error $\Delta z$ and the positional deviation $\Delta\sigma$ are reduced to satisfy the tolerance, the detection and movement are repeated.

In any case, preferably the gap setting is made first. Namely, preferably the detection of positional deviation and the adjustment of the mask or wafer position in the x direction is made after completion of the detection of the gap error and the adjustment of the mask or wafer position in the z direction.

Figure 5A:
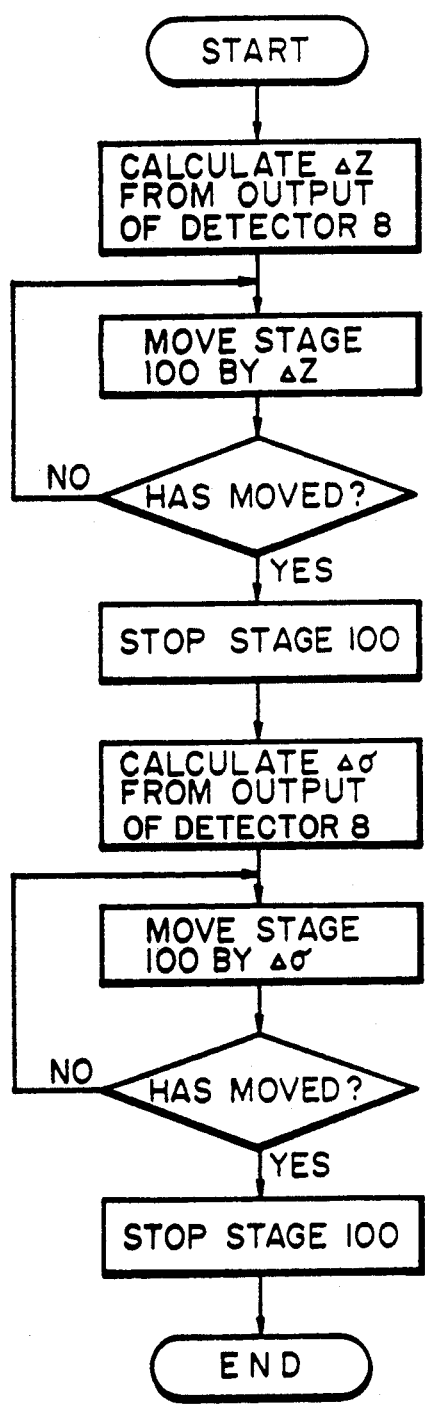
FIGS. 5A and 5B are flow charts, respectively, each showing the sequence of an alignment operation in the system of FIG. 2.
Figure 5B:
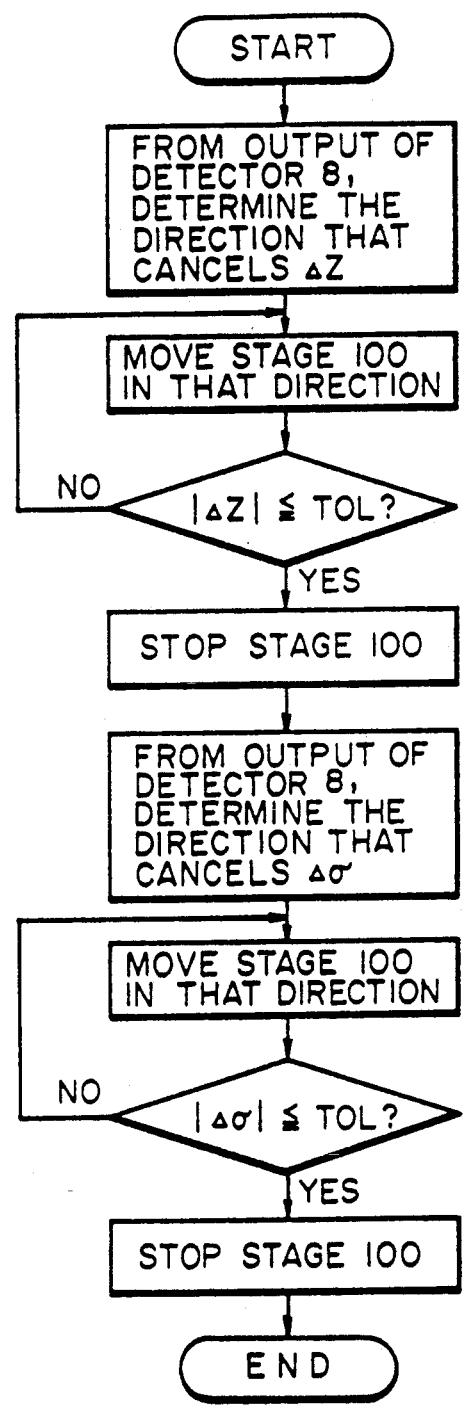

The sequence of the alignment operation to be performed with the use of the CPU 102, is illustrated in FIGS. 5A and 5B.

While in the present embodiment, the cylindrical lens 13 is used in the alignment head 6 for measurement of the gap between a mask and a wafer, the light 10a from the wafer may be directly received by the photodetector 8 without intervention of the lens 13. On that occasion, by detecting the gravity center position of the light 10a upon the light receiving surface 9 with respect to the y-axis direction, any change in the gap can be detected.

Figure 6:
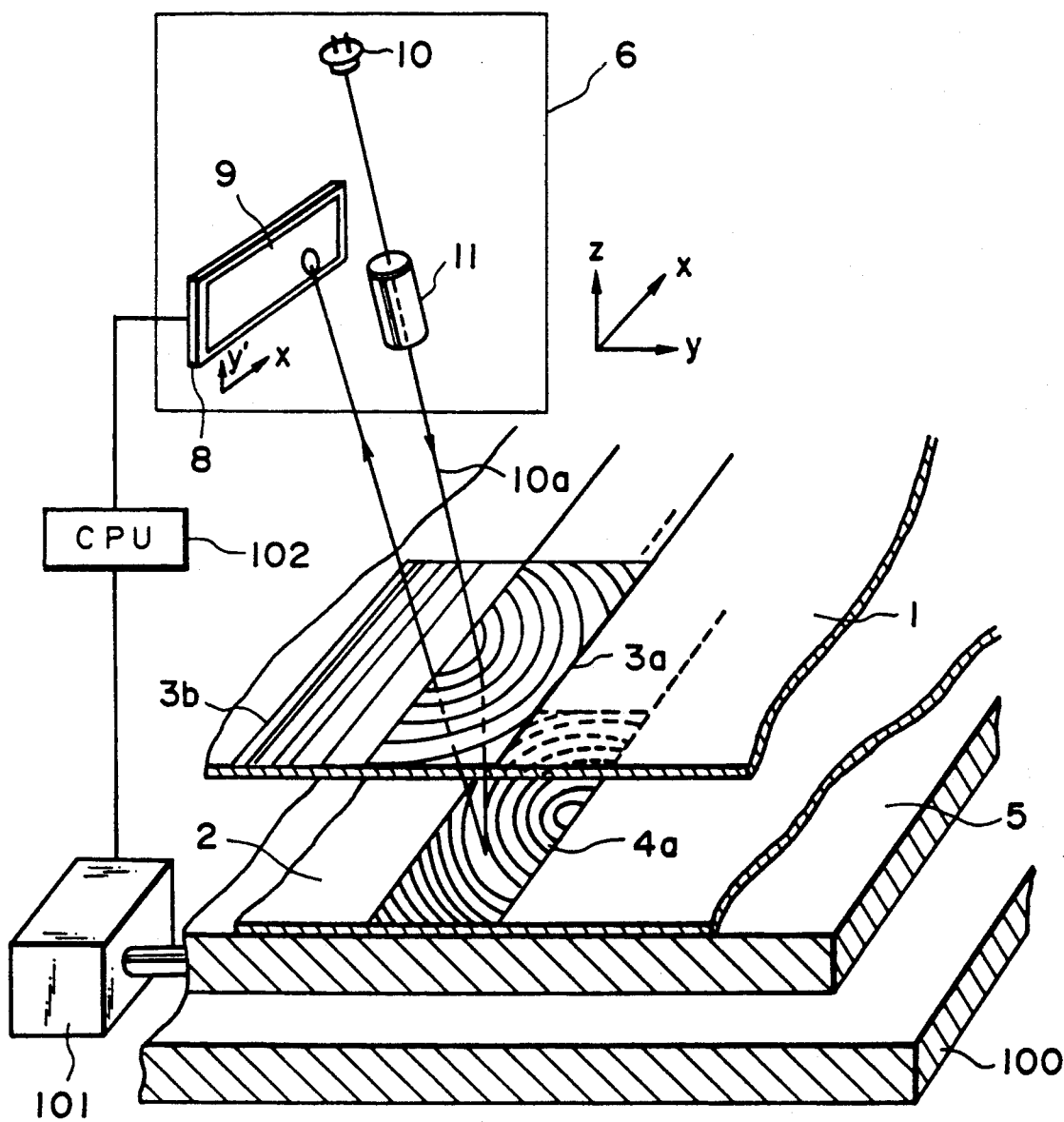
FIG. 6 is a schematic view of an alignment system according to a second embodiment of the present invention.

FIG. 6 is a schematic view of an alignment system according to a second embodiment of the present invention, which can be incorporated into an X-ray exposure apparatus, like the FIG. 2 embodiment Those numerals like the FIG. 2 embodiment are assigned to similar or corresponding elements An important feature of the present embodiment resides in that, adjacent a mark 3a on a mask 1, an auxiliary mark 3b comprising a linear Fresnel zone plate is provided, wherein the mark 3b has a power in a direction (y direction) perpendicular to the direction (x direction) with respect to which any positional deviation is to be detected. The mark 3b can serve like the cylindrical lens 13 of the first embodiment. Details will be explained below.

Light 10a emanates from a semiconductor laser 10 in an alignment head 6 and, after passing through a light projecting lens system 11, it impinges on the mark 3a on the mask 1 obliquely, as in the first embodiment. The light 10a is transmissively diffracted by the mark 3a and a first order diffraction light obtained thereby is simultaneously influenced by the convex lens function of the mark 3a, so that it is transformed into a convergent light and, while being converged, it impinges on a mark 4a provided on a wafer 2. The light 10a is reflectively diffracted by the mark 4a and, simultaneously therewith, it is influenced by a concave lens function of the mark 4a. After this, the light 10a is received by the auxiliary mark (linear Fresnel zone plate) 3b on the mask by which the light is influenced by a lens function only with respect to the y direction and, finally, it is received by a light receiving surface 9 of a photodetector 8 in the alignment head 6.

In the present embodiment, like the first embodiment, the marks 3a and 4a are each provided by a grating pattern having the same function as that of a cylindrical lens and having a power only with respect to the direction (x direction) with respect to which any positional deviation is to be detected. Also, each mark has a function as that of a deflecting element for deflecting the chief ray of the light 10a in the y-z plane.

The light 10a is neither influenced by any lens function nor influenced by any deflecting function, through the auxiliary mark 3b with respect to the direction in which the positional deviation is to be detected. Thus, the change in the gravity center position of the light 10a upon the light receiving surface 9 of the photodetector 8 in the x direction, corresponds to the relative positional deviation of the mask 1 and the wafer 2 in the x direction, as in the first embodiment.

As regards the gap detection, on the other hand, the light 10a is caused by the mark 4a of the wafer 2 to emanate therefrom obliquely at a certain angle $\psi$ in the y-z plane, with respect to a normal (z direction) to the wafer 2 surface or the mask 1 surface, and it impinges on the auxiliary mark 3b at a position which is changeable with the gap between the mask 1 and the wafer 2. Then, the light 10a emanates from the mask 1 at an angle which is changeable with the position of incidence thereof on the mark 3b and thus it emanates with a different projection component to the y-z plane, and finally it is received by the light receiving surface 9 of the photodetector 8 in the alignment head 6. By detecting the gravity center position of the light 10a on the light receiving surface 9 with respect to a direction perpendicular to the positional deviation detecting direction (x direction), by use of the photodetector 8, it is possible to measure the gap between the mask 1 and the wafer 2 at an enlarging magnification as determined on the basis of equation (b).

Figure 7:
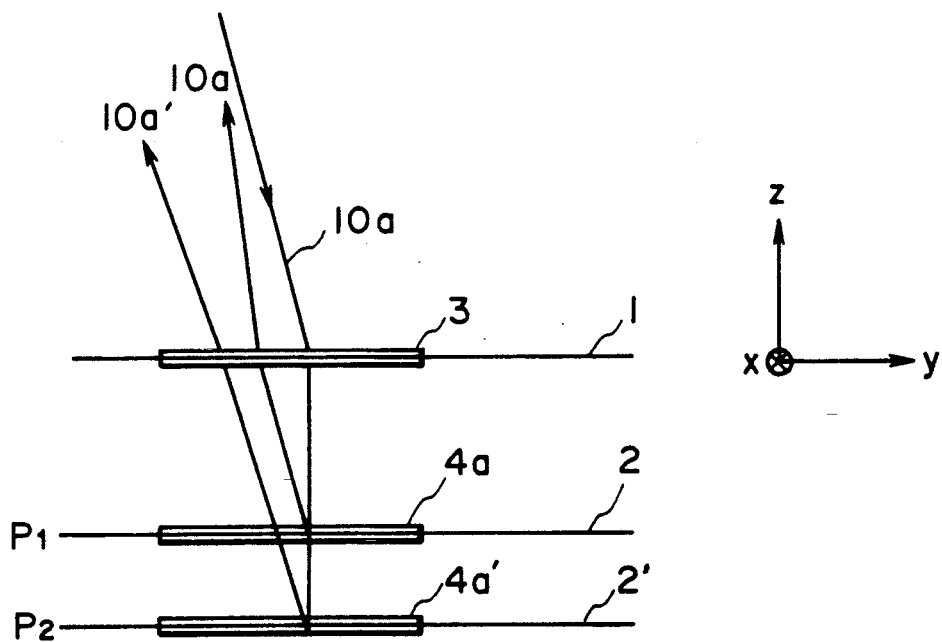
FIG. 7 is a schematic view, illustrating the principle of an alignment operation in an alignment system according to a third embodiment of the present invention.

FIG. 7 illustrates a position detecting system according to a third embodiment of the present invention. Since major components of this embodiment are essentially the same as those of the first embodiment, only the path of the light 10a as projected to the y-z plane, which is a characteristic feature of the present embodiment, is illustrated in FIG. 7. In the present embodiment, a mark 3c comprising a grating pattern is provided on a mask 1, and the mark 3c has a lens function with respect to both the position detecting direction (x direction) and a direction (y direction) perpendicular thereto Thus, the mark 3c can serve as an ordinary lens of what can be called a "rotationally symmetrical type". Since the principle of detecting three-dimensional relative positional deviation of the mask 1 and the wafer 2 with respect to the x, y and z directions, is essentially the same as that in the preceding embodiment, explanation thereof will be omitted here. Light 10a from an alignment head 6 is first diffracted by the mark 3c of the mask 1 and, simultaneously therewith, it is influenced by a convex lens function (concave lens function) of the mark 3c. Thus, in the form of a convergent light (divergent light), it impinges on a mark 4a of the wafer 2. The light 10a is diffracted again by the mark 4a and, additionally, it is influenced by the concave lens function (convex lens function) of the mark 4a, only with respect to the direction (x direction) in which the positional deviation is to be detected. Thereafter, the light is again diffracted by the mark 3c of the mask 1 and, when it is transmitted therethrough, it is influenced by the lens function with respect to the positional deviation detecting direction (x direction) and the direction (y direction) perpendicular thereto. Finally, the light is received by the photodetector 8 in the alignment head 6. In this manner, with respect to the x direction which is the direction in which the positional deviation is to be detected, the light is influenced by the lens action totally at least three times (at least once by each of the mask 1 and the wafer 2). On the other hand, with respect to the y direction perpendicular to the x direction, the light is influenced by the lens action by the mask 1, through "2×n" times (n=1, 2,...). Such a light is used for the detection. Also in the present embodiment, the signal processing for detection of the positional deviation is performed in the same manner as in the first embodiment. When the mark 3c of the mask 1 is equipped with a power also in the direction (y direction) perpendicular to the position detecting direction, as in the present embodiment, it is possible that the single mark 3c functions as the mark 3a and also as the auxiliary mark 3b of the second embodiment.

Figure 8:
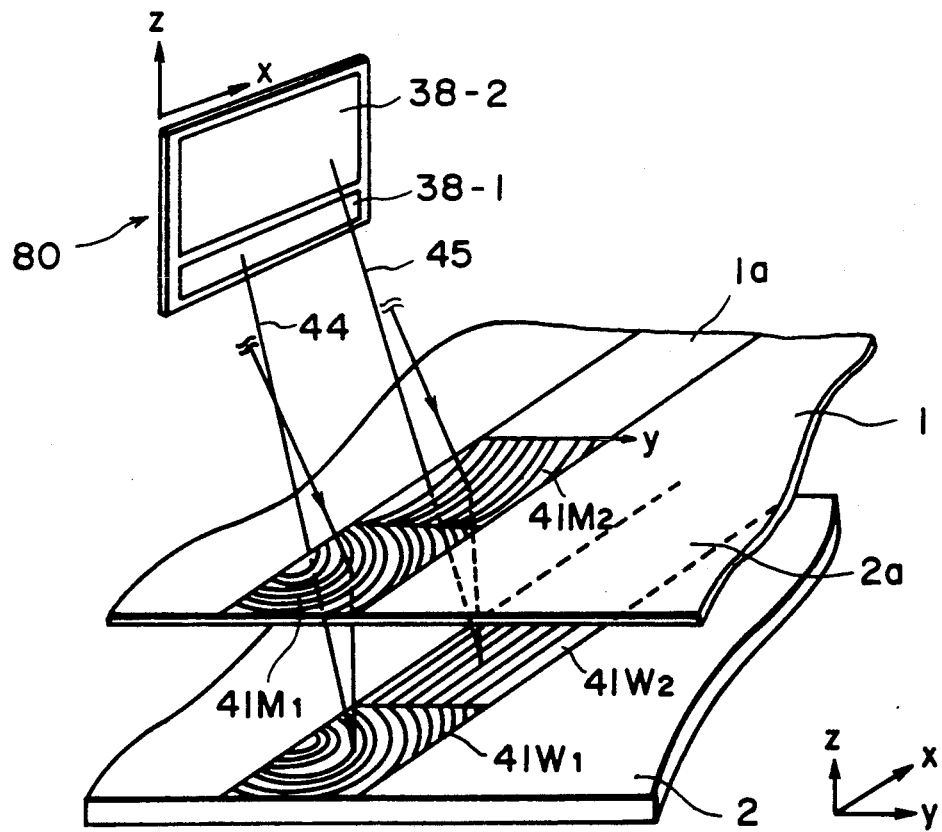
FIG. 8 is a schematic view of an alignment system according to a fourth embodiment of the present invention.

FIG. 8 shows a position detecting system according to a fourth embodiment of the present invention. Except for the structure of the photodetector used, the arrangement of various components placed in the alignment head as well as the structure of the x-y-z stage are the same as those of the first embodiment, and they are not illustrated. As for the physical optic element for measurement of the positional deviation and the gap, a mask 1 is provided with two marks $41M_1$ and $41M_2$ which are arrayed in the x direction while, on the other hand, a wafer 2 is provided with two marks $41W_1$ and $41W_2$ which are arrayed in the x direction. The mark $41W_2$ has no lens function but serves to reflectively diffract a received light.

A single bundle of parallel light impinges on the marks $41M_1$ and $41M_2$ and, as diffracted by these marks, the light is separated into a positional deviation detecting light 44 and a gap detecting light 45.

In this embodiment, as seen in FIG. 8, a positional deviation and gap change detecting sensor means comprises a one-dimensional (linear) CCD sensor 38-1 and a two-dimensional (area) CCD sensor 38-2 which are provided on a common planar substrate 80 and are arrayed in the z direction. The linear CCD sensor 38-1 has its sensing elements arrayed in the x direction, and the area CCD sensor 38-2 has its sensing elements arrayed in the x and y directions.

In this embodiment, the marks $41M_1$ and $41W_1$ are of the same structure as of the marks 3a and 4a of the first embodiment, respectively, such that the light 44 impinges on the sensor 38-1 with the relative positional deviation of the mask 1 and the wafer 2 in the x direction being transformed into a magnified displacement of the position of incidence of the light 44 on the sensor 38-1. Since the mark $41W_2$ has no lens function, the light 45 produced by the mark $41M_2$ is simply reflected by the mark $41W_2$ at a constant angle irrespective of the position of incidence of the light upon the mark $41W_2$. Therefore, any relative positional deviation of the mask 1 and the wafer 2 in the x direction or in the y direction does not result in a change in the position of incidence of the light 45 upon the sensor 38-2. Here, if the distance from the position of the light 44 (gravity center position) incident on the sensor 38-1 to the position of the light 45 (gravity center position) incident on the sensor 38-2 in the x direction, when the mask 1 and the wafer 2 have no relative positional deviation, is denoted by h, then the spacing in the x direction between the lights 44 and 45 incident on the substrate 80 as defined when the mask 1 and the wafer 2 are relatively deviated by $\Delta\sigma$ in the x direction, can be expressed by using equation (a) as follows:

$$\Delta\delta s = A \cdot \Delta\sigma + h \tag{c}$$

In the present embodiment, the constant A and the distance h are detected beforehand and, by using output signals of the sensors 38-1 and 38-2, the spacing in the x direction between the gravity center positions of the lights 44 and 45 is determined. By substituting the thus obtained $\Delta\delta s$ into equation (c), the positional deviation $\Delta\sigma$ can be detected. Namely, in this embodiment, the light 45 serves as a reference light for the detection of the positional deviation with respect to the x direction. If the wafer 2 is inclined relative to the mask 1, the position of incidence of the light 44 upon the sensor 38-1 in the x direction and the position of incidence of the light 45 upon the sensor 38-2 in the x direction, shift through the same distance. In the position detecting system of the present embodiment, the remainder obtainable by subtracting the amount of displacement detected by the sensor 38-2 from the amount of displacement detected by the sensor 38-1, is taken as an actual displacement of the position of incidence to the substrate 80 and, on the basis of this displacement, the relative positional deviation of the mask and the wafer in the x direction is detected. Therefore, it is possible to detect the relative positional deviation without being influenced by the inclination of the wafer 2.

The light 45 is also used to detect the gap between the mask and the wafer. The mark $41M_2$ comprises a grating pattern having a power both in the x and y directions. On the other hand, the mark $41W_2$ comprises a linear grating pattern of regular pitch adapted to reflect the light 45 at a constant angle irrespective of the position of incidence of the light 45 thereupon, as described. By detecting a change in the gravity center position of the light 45 on the sensor 38-2 in a direction (z direction in this example) perpendicular to the x direction, it is possible to detect the gap between the mask 1 and the wafer 2.

The distance h in the x direction between the gravity center positions of the light 44 and 45 to be assumed when the mask 1 and the wafer 2 have no relative positional deviation, can be set at any desired value by designing the four marks $41M_1$, $41M_2$, $41W_1$ and $41W_2$ accordingly. However, the value of distance h may be determined by trial printing after manufacture of these marks. Also, the gravity center position of the light 45 on the sensor 38-2 to be assumed when a correct gap is maintained between the mask and the wafer, namely, the reference position, can be determined by trial printing. A basic algorithm for the alignment and gap setting of the mask 1 and the wafer 2, according to the present embodiment, is such as follows:

(1) The y-axis position Ys of the gravity center of the light 45 upon the sensor 38-2 in the z direction, is detected.

(2) From Ys, the gap Z (the position of the wafer 2 relative to the mask 1 with respect to the z direction), is calculated.

(3) Comparing Z with a set value $Z_0$, whether or not the gap error is not greater than a tolerance $\epsilon_0$.

(4) If not greater than the tolerance, the wafer 2 is displaced by a driving stage through "$Z-Z_0$".

(5) Steps (1)–(4) are repeated until the relation $|Z-Z_0| \leq \epsilon_0$ is satisfied.

(6) The intensity distribution of the light 44 upon the sensor 38-1 is measured, and then the x-axis position Xs of the gravity center thereof is determined.

(7) Also, from the intensity distribution of the light 45 on the sensor 38-2, the x-axis position $X_R$ of the gravity center thereof is determined.

(8) The difference $\Delta\delta_S$ between $X_S$ and $X_R$ is calculated and, by using equation (c), the relative positional deviation $\Delta\sigma_1$ of the mask 1 and the wafer 2 in the x direction (i.e., the position of the wafer 2 relative to the mask 1 in the x direction), is calculated.

(9) Whether or not $\Delta\sigma_1$ is within a preset tolerable range ($\epsilon_1$–$\epsilon_2$) is discriminated.

(10) If $\Delta\sigma_1$ is not within the range ($\epsilon_1$–$\epsilon_2$), the wafer 2 is displaced by the driving stage to correct the positional deviation.

(11) The steps (6)–(10) are repeated until the relation $\epsilon_1 \leq \Delta\sigma_1 \leq \epsilon_2$ is satisfied.

Figure 9:
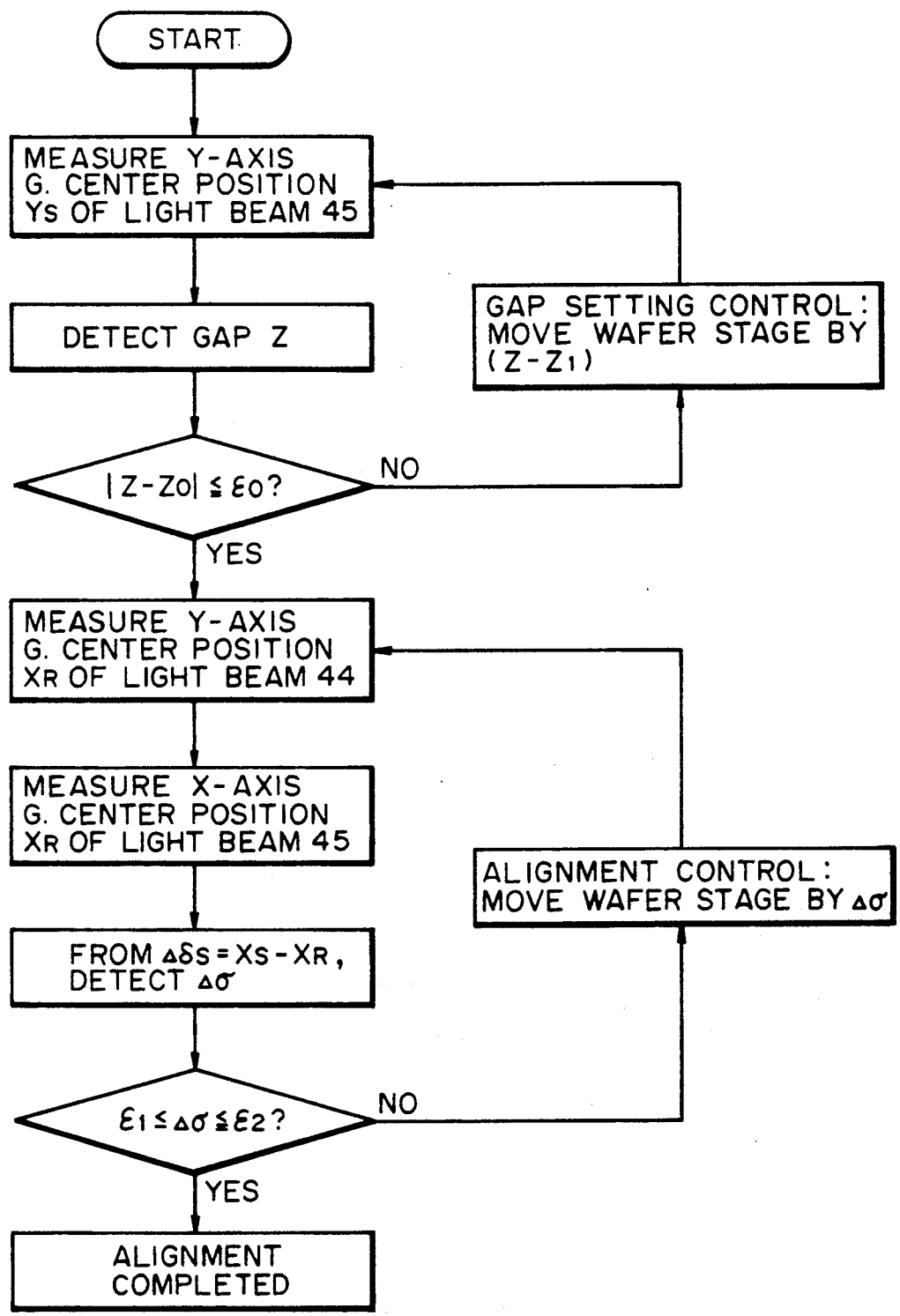
FIG. 9 is a flow chart, showing the sequence of an alignment operation in the system of FIG. 8.

The above-described sequential operation is illustrated in the flow chart of FIG. 9.

Figure 10:
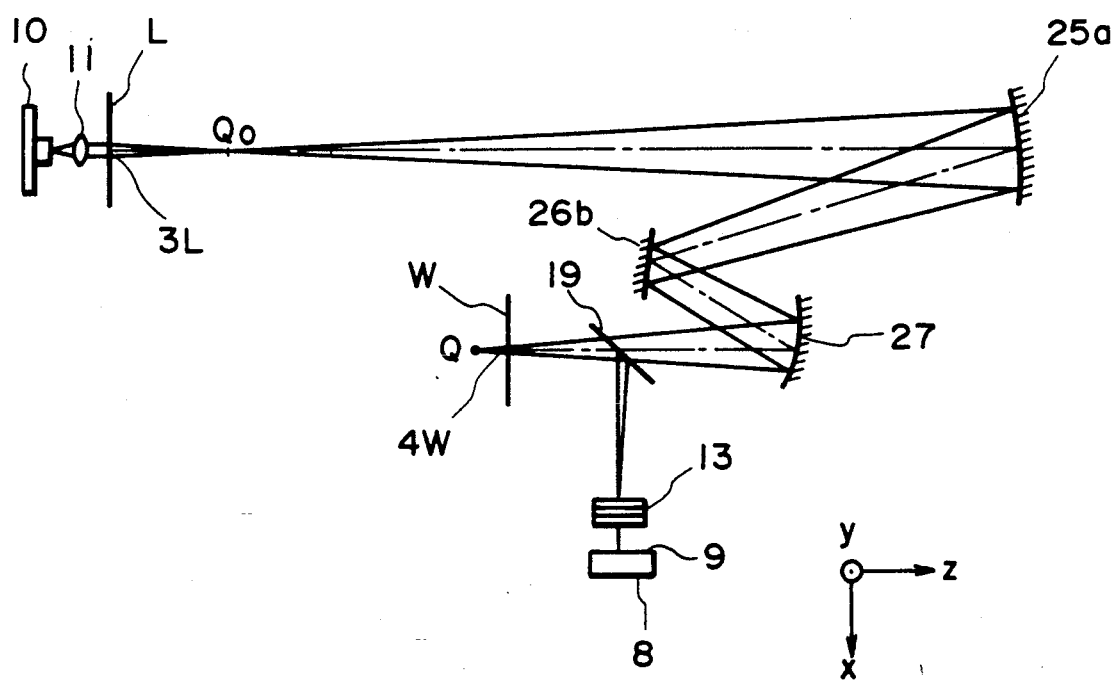
FIG. 10 is a schematic view, illustrating the optical arrangement of an alignment system according to a fifth embodiment of the present invention.

FIG. 10 is a schematic view showing a position detecting system according to a fifth embodiment of the present invention. In this embodiment, the position detecting system is incorporated into a semiconductor device manufacturing projection exposure apparatus that includes a reduction imaging system having three reflection mirrors 25a, 26a and 27.

In the drawing, an integrated circuit pattern formed on a reticle L is imaged on a wafer W surface by means of the reflection mirrors 25a, 26a and 27 in a reduced scale of 1:4. Here, by using light for exposure as supplied from an unshown illumination system, the wafer W is exposed to the reticle, by which the pattern of the reticle is printed on the wafer W.

As regards the alignment system, light emanating from a light source 10 is transformed by a light projecting lens system 11 into parallel light which illuminates a reticle alignment pattern 3L formed on the reticle L. The light is diffracted by the pattern 3L and the diffracted light goes by way of the reflection mirrors 25a, 26a and 27 and a half mirror 19, and it impinges on a wafer alignment pattern 4W. Then, the light is reflectively diffracted by the wafer alignment pattern 4W and, after being reflected by the half mirror 19, it impinges on a light receiving surface 9 of a photodetector 8. The reticle alignment pattern 3L and the wafer alignment pattern 4W comprise physical optic elements having the same functions as of the marks 3a and 4a of the first embodiment, respectively. The reticle alignment pattern 3L has a convex lens function only with respect to the x direction, and serves to converge, at a position $Q_0$, the received light into a linear light extending parallel to the y direction. Then, by means of the reflection mirrors 25a, 26a and 27, the light is projected to the wafer alignment pattern 4W so as to be converged linearly at a position Q. The wafer alignment pattern 4W has a convex mirror function with respect to the x direction, and serves to reflect the light having been impinged thereupon so as to be converged linearly at the position Q. The light reflected by the pattern 4W goes by way of the half mirror 19 and a cylindrical lens 13, having a power in the y direction, and finally it is collected at the light receiving surface 9 of the photodetector 8. Like the preceding embodiment, the positional deviation $\Delta\sigma$ of the reticle L and the wafer W with respect to the x direction is determined from the displacement $\Delta\delta$ of the gravity center position of the light incident on the light receiving surface Q with respect to the z direction while, on the other hand, the gap error $\Delta z$ between the reticle L and the wafer W is determined from the displacement $\Delta y$ of the gravity center position of the same light with respect to the y direction.

Figure 11:
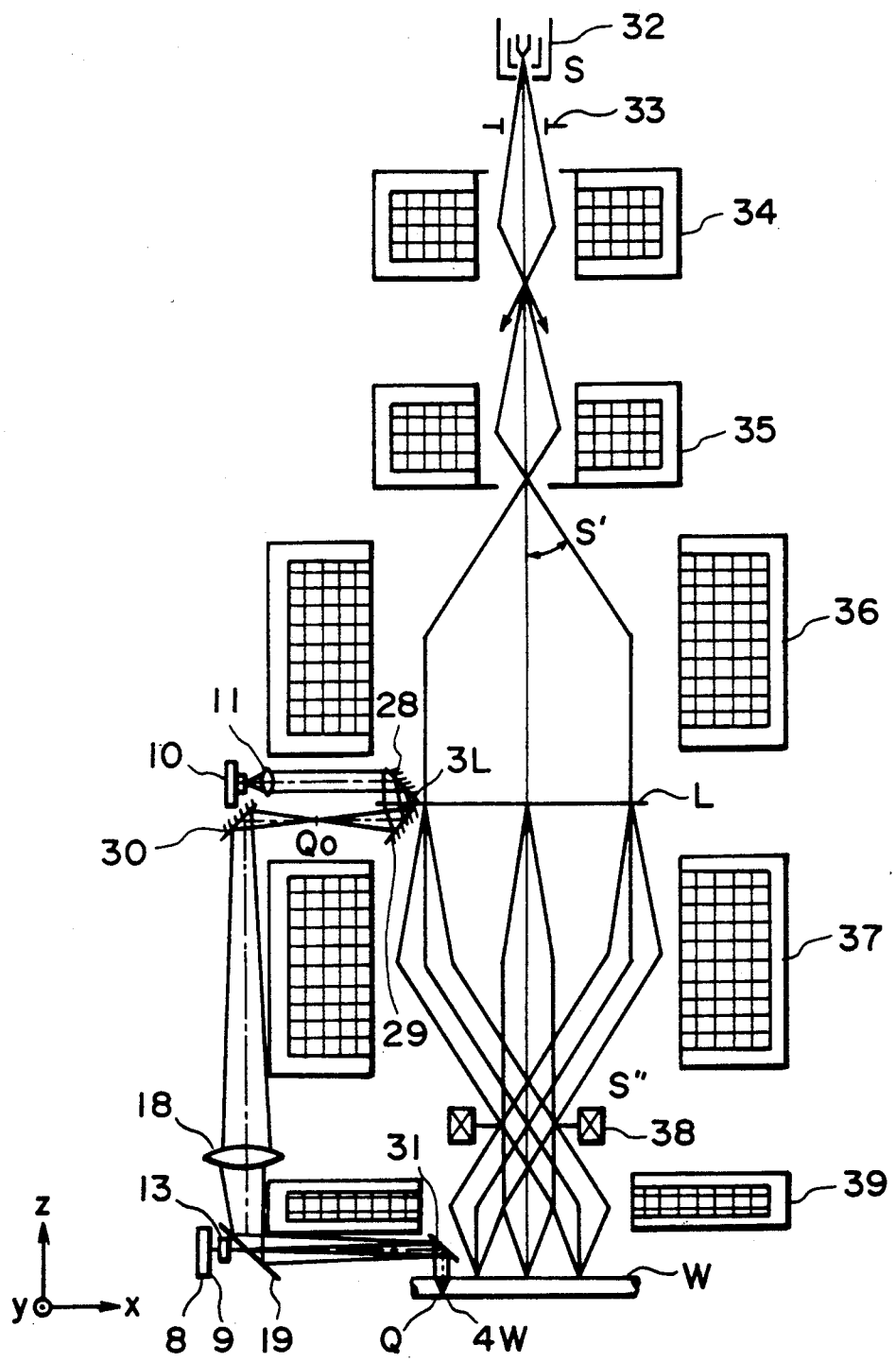
FIG. 11 is a schematic view of an alignment system according to a sixth embodiment of the present invention.

FIG. 11 is a schematic view of a position detecting system according to a sixth embodiment of the present invention. This embodiment is incorporated into a reduction projection type electron beam irradiating apparatus for manufacture of semiconductor devices.

In the drawing, an electron beam emanating from an electron gun 32 goes through a blanking plate 33 and, by means of a first condenser lens 34, a second condenser lens 35 and a third condenser lens 36, it is transformed into a parallel beam which irradiates a reticle L. The reticle L is formed with an integrated circuit pattern, prepared by forming openings in a metal film. The electron beam passes through this pattern and forms on the wafer W surface an image of the pattern of the reticle L in a reduced scale of 10:1, under the influence of a first projection lens 37, an aperture alignment coil 38 and a second projection lens 39. In this embodiment, the alignment pattern 3L of the reticle has a similar structure as that of the pattern 3L of the FIG. 10 embodiment, and the alignment pattern 4W of the wafer W has a similar structure as that of the pattern 4W of the FIG. 10 embodiment.

The alignment optical system is arranged as follows: Light emanating from an alignment light source 10 is transformed by a light projecting lens system 11 into parallel light which is projected by a mirror 28 to irradiate the alignment pattern 3L of the reticle L. By this alignment pattern 3L, the parallel light is diffracted and is influenced by the light collecting action thereof. After being reflected by a mirror 29, the light is focused at a point $Q_0$. Thereafter, the light path is deflected by a mirror 30 and, then, the light is transformed by a lens 18 again into a convergent light. The light path is deflected by a half mirror 19 and a mirror 31, and the light is projected to the wafer W so as to be converged at a point Q. The alignment pattern 4W provided on the wafer W reflectively diffracts the light, having been impinged thereupon so as to be converged at the point Q. The light from the pattern 4W is reflected by the mirror 31 and goes through the half mirror 19 and, after passing through a cylindrical lens 13 having a power in the y direction, it is collected at the light receiving surface 9 of the photodetector 8. The reticle alignment pattern 3L is set so that, by means of the lens 18, it is projected onto the wafer W in a reduced scale of 10:1, namely, at the same magnification of the electron beam exposure system (37, 38, 39). Therefore, any lateral deviation of the integrated circuit pattern of the reticle L and that of the reticle alignment pattern 3L correspond to each other, on the surface of the wafer W, in a one-to-one relationship.

As in the first embodiment described hereinbefore, in this embodiment, the relative positional deviation $\Delta\delta$ of the reticle L and the wafer W in the x direction is determined from the displacement $\Delta\delta$ of the gravity center position of the light incident on the light receiving surface 9 of the photodetector 8 with respect to the z direction, while the gap error $\Delta z$ of the reticle L and the wafer W is determined from the displacement $\Delta y$ of the gravity center position of the same in the y direction.

It is to be noted here that the present invention is not limited to an alignment system in a semiconductor device manufacturing exposure apparatus, but it is widely applicable, for example, to the alignment operation for the hologram device setting in hologram exposure and reproduction, the alignment operation in a multicolor printing machine, the alignment operation for adjustment of optical parts, an optical measuring system or the like, interval measurement for them, and the like. As regards the light to be used for the detection, such a light as having been diffracted by a grating pattern mark of a mask at an order other than the zero-th order, and thus having been influenced by a lens function and then having been reflected by a wafer at the zero-th order (i.e. specular reflection) and finally having been diffracted by the mark of the mask at an order other than the zero-th order, may be used. Alternatively, such a light having been transmitted through a mask at a zero-th order, having been reflectively diffracted by a grating pattern mark of a wafer at an order other than the zero-th order and thus having been influenced by a lens function, and finally having been diffracted by the mask at the zero-th order or a different order.

While the invention has been described with reference to the structures disclosed herein, it is not confined to the details set forth and this application is intended to cover such modifications or changes as may come within the purposes of the improvements or the scope of the following claims.

What is claimed is:

1. A position detection system for detecting the position of a substrate having a surface, with respect to a first direction perpendicular to the surface of the substrate and a second direction perpendicular to the first direction, by use of a mark formed on the substrate and having an optical power, said system comprising:

directing means for directing a radiation beam to the mark so that the radiation beam is deflected by the mark;

a sensor for receiving the radiation beam deflected by the mark, wherein the position of the radiation beam incident on said sensor is shiftable in a third direction in accordance with the position of the substrate with respect to the first direction and also is shiftable in a fourth direction, perpendicular to the third direction, in accordance with the position of the substrate with respect to the second direction, and wherein the mark is provided by a pattern having a predetermined power with respect to said second direction and having substantially no power with respect to a fifth direction orthogonal to both of said first and second directions; and detecting means for detecting the position of the substrate with respect to the first and second directions on the basis of an output of said sensor corresponding to the position of incidence of the radiation beam upon said sensor.

2. A system according to claim 1, wherein the pattern comprises a Fresnel zone plate.

3. A system according to claim 1, wherein the pattern is provided by a grating pattern.

4. A system according to claim 2 or 3, wherein the mark is arranged to deflect the radiation beam in a plane containing said first and fifth directions.

5. A system according to claim 2 or 3, wherein the mark is arranged to reflectively diffract the radiation beam to thereby deflect the same.

6. A system according to claim 2 or 3, wherein the mark is arranged to transmissively diffract the radiation beam to thereby deflect the same.

7. A system according to claim 2 or 3, wherein the mark is provided by a pattern by which the position of the deflected beam on said sensor does not change in said third direction with the position of the substrate in said second direction.

8. A system according to claim 1, wherein said directing means projects a parallel radiation beam to the mark, wherein the parallel radiation beam comprises the radiation beam.

9. A system according to claim 1, wherein said sensor comprises an area sensor.

10. A system according to claim 9, wherein said area sensor comprises a charge coupled device.

11. A system according to claim 9, further comprising a cylindrical lens having an optical power with respect to said third direction and being provided at a distance from said sensor longer than the focal length thereof, wherein said cylindrical lens is arranged to collect the deflected radiation beam and wherein, through said cylindrical lens, the deflected beam is projected to said sensor.

12. A position detecting system for detecting the relative position of a first substrate having a surface relative to a second substrate opposed to the first substrate, with respect to a first direction substantially perpendicular to the surface of the first substrate and a second direction perpendicular to the first direction, by use of a first mark formed on the first substrate and having an optical power and a second mark formed on the second substrate and having an optical power, said system comprising:

directing means for directing a radiation beam to the second mark, whereby the optical power of the second mark influences the radiation beam, and for directing the influenced radiation beam to the first mark, whereby the influenced radiation beam is further influenced by the optical power of the first mark and is deflected by the first mark;

a sensor for receiving the radiation beam deflected by the first mark, wherein the position of the radiation beam incident on said sensor is shiftable in a third direction in accordance with the position of the first substrate with respect to the first direction and also is shiftable in a fourth direction, perpendicular to the third direction, in accordance with the position of the first substrate with respect to the second direction; and detecting means for detecting the position of the first substrate with respect to the first and second directions on the basis of an output of said sensor corresponding to the position of incidence of the radiation beam upon said sensor.

13. A system according to claim 12, wherein each of the first and second marks comprises a pattern having a predetermined power with respect to said second direction and having substantially no power with respect to a fifth direction orthogonal to both said first and second directions.

14. A system according to claim 13, wherein the pattern comprises a Fresnel zone plate.

15. A system according to claim 13, wherein the pattern is provided by a grating pattern.

16. A system according to claim 14 or 15, wherein each of the first and second marks is arranged to deflect the radiation beam in a plane containing said first and fifth directions.

17. A system according to claim 14 or 15, wherein the first mark is arranged to reflectively diffract the radiation beam to thereby deflect the same.

18. A system according to claim 14 or 15, wherein the first mark is arranged to transmissively diffract the radiation beam to thereby deflect the same.

19. A system according to claim 14 or 15, wherein each of the first and second marks is provided by a pattern by which the position of the deflected radiation beam on said sensor does not change in said third direction with the position of the substrate in said second direction.

20. A system according to claim 12, wherein said directing means projects a parallel radiation beam to the mark, wherein the parallel radiation beam comprises the radiation beam.

21. A system according to claim 12, wherein said sensor comprises an area sensor.

22. A system according to claim 21, wherein said area sensor comprises a charge coupled device.

23. A system according to claim 21, further comprising a cylindrical lens having an optical power with respect to said third direction and being provided at a distance from said sensor longer than the focal length thereof, wherein said cylindrical lens is arranged to collect the deflected radiation beam and wherein, through said cylindrical lens, the deflected beam is projected to said sensor.

24. A system according to claim 12, wherein the second mark comprises a first pattern having a predetermined power with respect to said second direction and having substantially no power with respect to said fifth direction orthogonal to both said first and second directions a second pattern having a predetermined power with respect to both said second and fifth directions, wherein a portion of the radiation beam is deflected by the first pattern to produce a first beam and another portion of the radiation beam is deflected by the second pattern to produce a second beam; wherein the first mark comprises a third pattern having a predetermined power with respect to said second direction and having substantially no power with respect to said fifth direction, and a fourth pattern having substantially no power with respect to both of said second and fifth directions, wherein the first beam is deflected by the third pattern and is directed to said sensor, and the second beam is deflected by the fourth pattern and is directed to said sensor; and wherein said sensor produces a first signal corresponding to the position of the first beam on said sensor with respect to said fourth direction, and a second signal corresponding to the position of the second beam on said sensor with respect to said third direction.

25. A system according to claim 12, wherein the power of each of the first and second marks is determined so that relative positional deviation of the first substrate to the second substrate with respect to said second direction is detected as an enlarged deviation of the beam upon said sensor with respect to said fourth direction.

26. A system according to claim 12, wherein the second substrate comprises a third mark having substantially no power with respect to said second direction and having a predetermined power with respect to said fifth direction, and wherein the first mark is arranged to reflect and deflect the radiation beam toward the third mark, the radiation beam being directed through the third mark to said sensor.

27. A system according to claim 26, wherein the third mark is provided by a one-dimensional Fresnel zone plate.

28. A system according to claim 12, wherein the first mark comprises a pattern having a predetermined power with respect to said second direction and having substantially no power with respect to a fifth direction orthogonal to said first and second directions, wherein the second mark comprises a pattern having a predetermined power with respect to said second and fifth directions.

29. A system according to claim 28, wherein the first mark is arranged to deflect the radiation beam toward the second mark, by which through the second mark said sensor receives the radiation beam.

30. An exposure apparatus usable with first and second substrates opposed to each other, for exposing the first substrate to a circuit pattern of the second substrate with radiation, wherein the first substrate is formed with a first mark having an optical power while the second substrate is formed with a second mark having an optical power, said apparatus comprising:

directing means for directing a radiation beam to the second mark, whereby the optical power of the second mark influences the radiation beam, and for directing the influenced radiation beam to the first mark, whereby the influenced radiation beam is further influenced by the optical power of the first mark and is deflected by the first mark;

a sensor for receiving the radiation beam deflected by the first mark, wherein, when a first direction is taken as a direction substantially perpendicular to a surface of the first substrate and a second direction is taken as a direction perpendicular to the first direction, the position of the radiation beam incident on said sensor is shiftable in a third direction in accordance with the relative position of the first substrate to the second substrate with respect to the first direction and also is shiftable in a fourth direction, perpendicular to the third direction, in accordance with the relative position o the first substrate to the second substrate with respect to the second direction;

detecting means for detecting the relative position of the first substrate with respect to the first and second directions on the basis of an output of said sensor corresponding to the position of incidence of the radiation beam upon said sensor; and adjusting means for adjusting the positional relationship between the first and second substrate with respect to the first and second directions, on the basis of the detection by said detecting means.

31. A system according to claim 30, wherein said detecting means and said adjusting means cooperate with each other to detect the position of the deflected beam with respect to said third direction and to adjust the relative position of the first and second substrates with respect to said first direction and thereafter, to detect the position of the deflected beam with respect to said fourth direction and to adjust the relative position of the first and second substrates with respect to said second direction.

32. An exposure apparatus usable with first and second substrates opposed to each other, for exposing the first substrate to a circuit pattern of the second substrate with radiation, wherein the first substrate is formed with a mark having an optical power, said apparatus comprising:

directing means for directing a radiation beam to the mark so that the radiation beam is deflected by the mark;

a sensor for receiving the radiation beam deflected by the mark, wherein, when a first direction is taken as a direction substantially perpendicular to a surface of the first substrate and a second direction is taken as a direction perpendicular to the first direction, the position of the radiation beam incident on said sensor is shiftable in a third direction in accordance with the relative position of the first substrate to the second substrate with respect to the first direction and also is shiftable in a fourth direction, perpendicular to the third direction, in accordance with the relative position of the first substrate to the second substrate with respect to the second direction, and wherein the mark is provided by a pattern having a predetermined power with respect to said second direction and having substantially no power with respect to a fifth direction orthogonal to both of said first and second directions;

detecting means for detecting the relative position of the first substrate with respect to the first and second directions on the basis of an output of said sensor corresponding to the position of incidence of the radiation beam upon said sensor; and adjusting means for adjusting the positional relationship between the first and second substrates with respect to the first and second directions, on the basis of the detection by said detecting means.

33. A system according to claim 32, wherein said detecting means and said adjusting means cooperate with each other to detect the position of the deflected beam with respect to said third direction and to adjust the relative position of the first and second substrates with respect to said first direction and thereafter, to detect the position of the deflected beam with respect to said fourth direction and to adjust the relative position of the first and second substrates with respect to said second direction.

34. A detection method usable with a substrate including a mark having an optical power, wherein a light image is formed on a detection plane by the mark of the substrate and wherein the level of the surface of the substrate in a first direction and the position of the substrate with respect to a second direction, substantially parallel to the surface of the substrate, are detected on the basis of the position of the light image on the detection plane, said method comprising the steps of:

providing the mark as a pattern having an optical power with respect to the second direction, but having substantially no optical power with respect to a third direction perpendicular to the second direction;

projecting a radiation beam to the mark such that the beam is deflected by the mark with respect to the third direction and the light image is formed on the detection plane by the deflected beam; and determining the level and the position of the substrate on the basis of the position of the light image upon the detection plane, related to the first and second directions.

35. A method according to claim 34, further comprising providing the mark as a zone plate pattern.

36. A method according to claim 35, further comprising deflecting th radiation beam by the pattern of the mark in response to the radiation beam perpendicularly impinging upon th substrate surface, and directing the radiation beam to the mark so as to be perpendicularly incident on the substrate surface.

37. A method according to claim 36, further comprising deflecting the radiation beam by a zone plate pattern provided on another substrate, and causing the deflected beam to be perpendicularly incident on the mark.

38. A semiconductor device manufacturing method usable with a wafer including a mark having an optical power, wherein a light image is formed on a detection plane by the mark of the wafer, wherein the level of the surface of the wafer in a first direction and the position of the wafer with respect to a second direction, substantially parallel to the surface of the wafer, are detected on the basis of the position of the light image on the detection plane, and wherein after the wafer is set at a desired level and a desired position a circuit pattern is printed on the wafer, said method comprising the steps of:

providing the mark as a pattern having an optical power with resect to the second direction, but having substantially no optical power with respect to a third direction perpendicular to the second direction;

projecting a radiation beam to the mark such that the beam is deflected by the mark with respect to the third direction and the light image is formed on the detection plane by the deflected beam; and determining the level and the position of the wafer on the basis of the position of the light image upon the detection plane, related to the first and second directions.

39. A method according to claim 38, further comprising providing the mark as a zone plate pattern.

40. A method according to claim 39, further comprising deflecting the radiation beam by the pattern of the mark in response to the radiation beam perpendicularly impinging upon the wafer surface, and directing the radiation beam to the mark so as to be perpendicularly incident on the wafer surface.

41. A semiconductor device manufacturing method usable with a mask including a circuit pattern and a first mark having an optical power and a wafer including a second mark having an optical power, wherein a light image is formed on a detection plane by the first and second marks of the mask and the wafer, wherein the level of the surface of the wafer with respect to the mask in a first direction and the position of the wafer with respect to a second direction, substantially parallel to the surface of the wafer, are detected on the basis of the position of the light image on the detection plane, and wherein after the wafer is set at a desired level and a desired position the wafer is exposed to the circuit pattern of the mask whereby the circuit pattern is printed on the wafer, said method comprising the steps of:

projecting a radiation beam to the first and second marks such that the optical powers of the first and second marks receptively influence the radiation beam, wherein the beam is reflectively deflected by the second mark and the light image is formed on the detection plane by the deflected beam; and determining the level and the position of the wafer on the basis of the position of the light image upon the predetermined plane, related to the first and second directions.

42. A method according to claim 41, wherein the second mark comprises a pattern having an optical power with respect to the first direction, but having substantially no power with respect to the second direction.

43. A method according to claim 42, wherein each of the first and second marks comprise a zone plate pattern.

44. A method according to claim 43, further comprising deflecting the radiation beam by the pattern of the second mark in response t the radiation beam perpendicularly impinging upon the wafer surface, and deflecting the radiation beam by the pattern of the first mark so that the radiation beam is perpendicularly incident on the wafer surface.

45. A method according to claim 44, wherein the first mark comprises a pattern having an optical power with respect to the first direction, but having substantially no optical power with respect to the second direction.

46. An exposure apparatus usable with first and second substrates opposed to each other, for exposing the first substrate to a circuit pattern of ht second substrate with radiation, wherein the first substrate includes a first mark having an optical power while the second substrate includes a second mark having an optical power, said apparatus comprising:

directing means for direction a radiation beam to the first mark, whereby the optical power of the first mark influences the radiation beam, and for directing the influenced radiation beam to the second mark, whereby the influenced radiation beam is further influenced by the optical power of the second mark and is deflected by the second mark;

a sensor for receiving the radiation beam deflected by the second mark, wherein, when a first direction is taken as a direction substantially perpendicular to a surface of the first substrate and a second direction is taken as a direction perpendicular to the first direction, a position of incidence of the radiation beam on said sensor shifts in a third direction in accordance with the position of the first substrate relative to the second substrate with respect to the first direction and also shifts in a fourth direction, perpendicular to the third direction, in accordance with the position of the first substrate relative to the second substrate with respect to the second direction;

detecting means for detecting the relative position of the first substrate with respect to the first and second directions on the basis of an output of said sensor corresponding to the position of incidence of the radiation beam upon said sensor; and adjusting means for adjusting the positional relationship between the first and second substrates with respect to the first and second direction, on the basis for the detecting by said detecting means.

* * * * *

UNITED STATES PATENT AND TRADEMARK OFFICE
CERTIFICATE OF CORRECTION

PATENT NO. : 5,148,036

DATED : September 15, 1992

INVENTOR(S) : Masakazu Matsugu, et al.

It is certified that error appears in the above-identified patent and that said Letters Patent is hereby corrected as shown below:

COLUMN 5

Line 26, "similarly" should read --similar--;
    Line 44, "stage 101" should read --stage 100--; and
    Line 62, "driver 100" should read --driver 101--.

COLUMN 6

Line 61, "micron" should read --microns--.

COLUMN 12

Line 23, "microns" should read --microns.--; and
    Line 41, "is" (first occurrence) should read --in--.

COLUMN 14

Line 18, "embodiment" should read --embodiment.--; and
    Line 20, "elements" should read --elements.--.

COLUMN 15

Line 26, "thereto" should read --thereto.--.

COLUMN 17

Line 22, "light" should read --lights--.

UNITED STATES PATENT AND TRADEMARK OFFICE
CERTIFICATE OF CORRECTION

PATENT NO. : 5,148,036

DATED : September 15, 1992

INVENTOR(S) : Masakazu Matsugu, et al.

It is certified that error appears in the above-identified patent and that said Letters Patent is hereby corrected as shown below:

COLUMN 22

Line 8, "tions" should read --tions,--.

COLUMN 23

Line 14, "o" should read --of--; and
Line 26, "A system" should read --An apparatus--.

COLUMN 24

Line 5, "A system" should read --An apparatus--;
Line 40, "th" should read --the--;
Line 42, "th" should read --the--; and
Line 63, "resect" should read --respect--.

COLUMN 25

Line 40, "predetermined" should read --detection--; and
Line 48, "comprise" should read --comprises--.

UNITED STATES PATENT AND TRADEMARK OFFICE
CERTIFICATE OF CORRECTION

PATENT NO. : 5,148,036

DATED : September 15, 1992

INVENTOR(S) : Masakazu Matsugu, et al.

It is certified that error appears in the above-identified patent and that said Letters Patent is hereby corrected as shown below:

<u>COLUMN 26</u>

```
Line 3, "t" should read --to--;
Line 14, "ht" should read --the--;
Line 19, "direction" should read --directing--; and
Line 47, "direction," should read --directions,--.
```

Signed and Sealed this

Second Day of November, 1993

Attest:

BRUCE LEHMAN

Attesting Officer

Commissioner of Patents and Trademarks